(12) United States Patent
Shim et al.

(10) Patent No.: US 8,488,402 B2
(45) Date of Patent: Jul. 16, 2013

(54) NONVOLATILE MEMORY DEVICE AND METHOD OF READING THE SAME USING DIFFERENT PRECHARGE VOLTAGES

(75) Inventors: Sunil Shim, Seoul (KR); Woonkyung Lee, Seongnam-si (KR); Jaehoon Jang, Seongnam-si (KR); Kihyun Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 108 days.

(21) Appl. No.: 13/280,421

(22) Filed: Oct. 25, 2011

(65) Prior Publication Data

US 2012/0099387 A1    Apr. 26, 2012

(30) Foreign Application Priority Data

Oct. 25, 2010    (KR) ................. 10-2010-0104107

(51) Int. Cl.
  *G11C 11/34*    (2006.01)
  *G11C 16/04*    (2006.01)
  *G11C 7/10*    (2006.01)

(52) U.S. Cl.
  USPC .............. 365/203; 365/185.11; 365/185.17; 365/185.25; 365/189.14; 365/189.05

(58) Field of Classification Search
  USPC ............. 365/230.08, 189.05, 203, 130, 208
  See application file for complete search history.

(56) References Cited

U.S. PATENT DOCUMENTS

| | | | |
|---|---|---|---|
| 5,991,224 A | 11/1999 | Aipperspach et al. | |
| 7,633,828 B2 * | 12/2009 | Scheuerlein et al. | 365/230.06 |
| 7,843,733 B2 | 11/2010 | Kim et al. | |
| 2006/0198191 A1 * | 9/2006 | Nakai | 365/185.13 |
| 2008/0310230 A1 | 12/2008 | Kim et al. | |
| 2010/0054036 A1 * | 3/2010 | Lee et al. | 365/185.03 |
| 2010/0290276 A1 * | 11/2010 | Choi | 365/163 |

FOREIGN PATENT DOCUMENTS

| | | |
|---|---|---|
| JP | 2008-310949 | 12/2008 |
| KR | 1020070021370 A | 2/2007 |
| KR | 1020090049373 A | 5/2009 |
| KR | 10-0909968 | 7/2009 |

\* cited by examiner

*Primary Examiner* — Son Dinh
*Assistant Examiner* — Uyen B Tran
(74) *Attorney, Agent, or Firm* — Volentine & Whitt, PLLC

(57) ABSTRACT

A nonvolatile memory device includes a substrate, multiple doping regions, multiple cell strings and multiple page buffers. The doping regions extend in a first direction along the substrate and are spaced apart from one another in a second direction. The cell strings are provided according to a specific pattern between adjacent first and second doping regions among the multiple regions, each of the cell strings including multiple cell transistors stacked in a third direction perpendicular to the substrate. The page buffers are connected to the cell strings through bit lines, the page buffers being configured to provide precharge voltages to the bit lines during a read operation. Levels of the precharge voltages provided to the bit lines vary depending on distances between the cell strings and at least one of the first and second doping regions, respectively.

20 Claims, 39 Drawing Sheets

NONVOLATILE MEMORY DEVICE AND METHOD OF READING THE SAME USING DIFFERENT PRECHARGE VOLTAGES

CROSS-REFERENCE TO RELATED APPLICATIONS

A claim of priority under 35 U.S.C. §119 is made to Korean Patent Application No. 10-2010-0104107, filed on Oct. 25, 2010, in the Korean Intellectual Property Office, the entire contents of which are hereby incorporated by reference.

BACKGROUND

The present inventive concept herein relates to semiconductor memories, and more particularly, to a nonvolatile memory device having a three dimensional structure, a method of reading the same and a memory system including the same.

Semiconductor memory devices are embodied using semiconductors such as silicon, germanium, gallium arsenide and indium phospide. Semiconductor memory devices are classified into volatile memory devices and nonvolatile memory devices.

Volatile memory devices lose their stored data when power supplies are interrupted. Volatile memory devices may include static random access memory (SRAM), dynamic RAM (DRAM) and synchronous DRAM (SDRAM), for example. Nonvolatile memory devices maintain stored data even when power supplies are interrupted. Nonvolatile memory devices may include read only memory (ROM), programmable ROM (PROM), electrically programmable ROM (EPROM), electrically erasable and programmable ROM (EEPROM), flash memory, phase change RAM (PRAM), magnetic RAM (MRAM), resistive RAM (RRAM) and ferroelectric RAM (FRAM), for example. Flash memory devices are classified into NOR-type flash memory devices and NAND-type flash memory devices.

To improve integration, semiconductor memory devices having a three dimensional structure are being studied.

SUMMARY

Embodiments of the inventive concept provide a nonvolatile memory device that includes a substrate, multiple doping regions, multiple cell strings and multiple page buffers. The doping regions extend in a first direction along the substrate and are spaced apart from one another in a second direction. The cell strings are provided according to a specific pattern between adjacent first and second doping regions among the multiple regions, each of the cell strings including multiple cell transistors stacked in a third direction perpendicular to the substrate. The page buffers are connected to the cell strings through bit lines, the page buffers being configured to provide precharge voltages to the bit lines during a read operation. Levels of the precharge voltages provided to the bit lines vary depending on distances between the cell strings and at least one of the first and second doping regions, respectively.

Further embodiments of the inventive concept provide a method of reading data from memory cells in a plurality of cell strings of a nonvolatile memory device. The method includes setting a precharge voltage for each cell string of the plurality of cell strings, a level of the precharge voltage including one multiple different precharge voltage levels depending on a distance of the cell string from a doping region on a substrate; and providing the set precharge voltage to each cell string of the plurality of cell strings through a plurality of bit lines connected to the plurality of cell strings.

BRIEF DESCRIPTION OF THE FIGURES

Illustrative embodiments will be more clearly understood from the following detailed description taken in conjunction with the accompanying drawings.

DETAILED DESCRIPTION OF THE EMBODIMENTS

Figure 1:
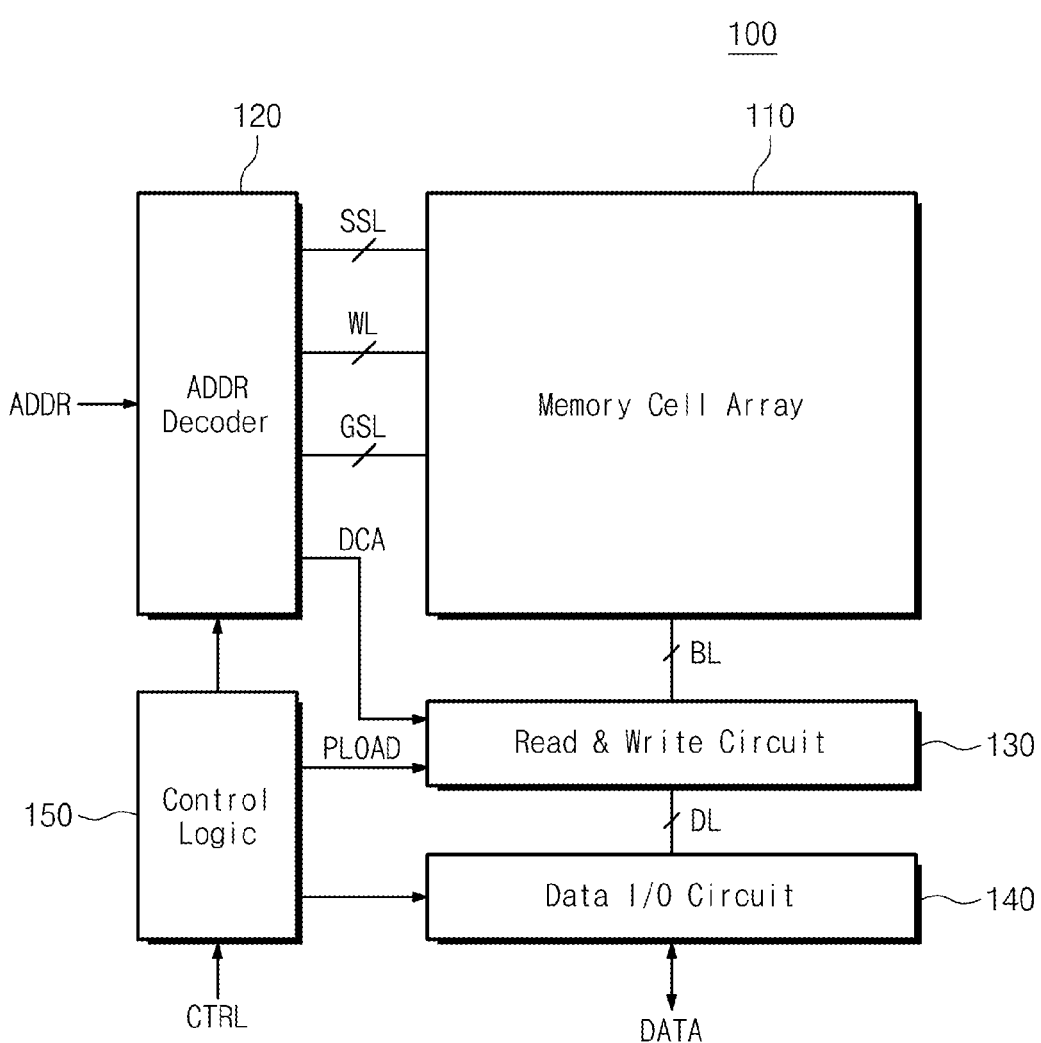
FIG. 1 is a block diagram illustrating a nonvolatile memory device, according to embodiments of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

FIG. 1 is a block diagram illustrating a nonvolatile memory device 100, according to various embodiments. Referring to FIG. 1, the nonvolatile memory device 100 includes a memory cell array 110, an address decoder 120, a read and write circuit 130, a data input/output circuit 140 and control logic 150.

The memory cell array 110 may include multiple memory cell groups. For example, the memory cell array 110 may include multiple cell strings arranged along row and column directions. Each cell string may include memory cells stacked along a direction perpendicular to a substrate. That is, the memory cells are provided along a row and a column on the substrate and are stacked in a direction perpendicular to the substrate to form a three dimensional structure. The memory cell array 110 also may include memory cells that can store one or more bits per cell.

The address decoder 120 is connected to the memory cell array 110 through word lines WL, string select lines SSL and ground select lines GSL. The address decoder 120 is controlled by the control logic 150. The address decoder 120 receives an address ADDR from the outside.

The address decoder 120 is configured to decode a row address among the received addresses ADDR, and to select a word line corresponding to the decoded row address among the word lines WL. The address decoder 120 is further configured to select a string select line SSL and a ground select line GSL corresponding to the decoded row address among the string select lines SSL and the ground select lines GSL. The address decoder 120 is further configured to decode a column address among the received addresses ADDR. The address decoder 120 transfers the decoded column address DCA to the read and write circuit 130. The address decoder 120 may include a row decoder for decoding a row address, a column decoder for decoding a column address and an address buffer for storing the received address ADDR.

The read and write circuit 130 is connected to the memory cell array 110 through bit lines BL and is connected to the data input/output circuit 140 through data lines DL. The read and write circuit 130 operates under control of the control logic 150. The read and write circuit 130 receives the decoded column address DCA from the address decoder 120, and selects bit lines BL in response to the decoded column address DCA.

The read and write circuit 130 receives data from the data input/output circuit 140 and writes the received data to the memory cell array 110. In addition, the read and write circuit 130 reads data from the memory cell array 110 and transfers the read data to the data input/output circuit 140. For example, the read and write circuit 130 may read data from a first storage region of the memory cell array 110 and write the read data to a second storage region of the memory cell array 110. That is, the read and write circuit 130 performs a copy-back operation.

The read and write circuit 130 may include various constituent elements, such as a page buffer (or page register) and a column select circuit. Also, the read and write circuit 130 may include additional constituent elements, such as a sense amplifier, a write driver and a column select circuit.

The data input/output circuit 140 is connected to the read and write circuit 130 through data lines DL. The data input/output circuit 140 operates in under control of the control logic 150. The data input/output circuit 140 is configured to exchange data DATA with the outside. In particular, the data input/output circuit 140 is also configured to transfer data DATA received from the outside to the read and write circuit 130 through the data lines DL, and to output data DATA transferred from the read and write circuit 130 through the data lines DL to the outside. The data input/output circuit 140 may include various constituent elements, such as a data buffer.

The control logic 150 is connected to and controls the address decoder 120, the read and write circuit 130 and the data input/output circuit 140. The control logic 150 is configured to control the entire operation of the nonvolatile memory device 100. For example, the control logic 150 provides a load signal PLOAD to the read and write circuit 130.

Figure 2:
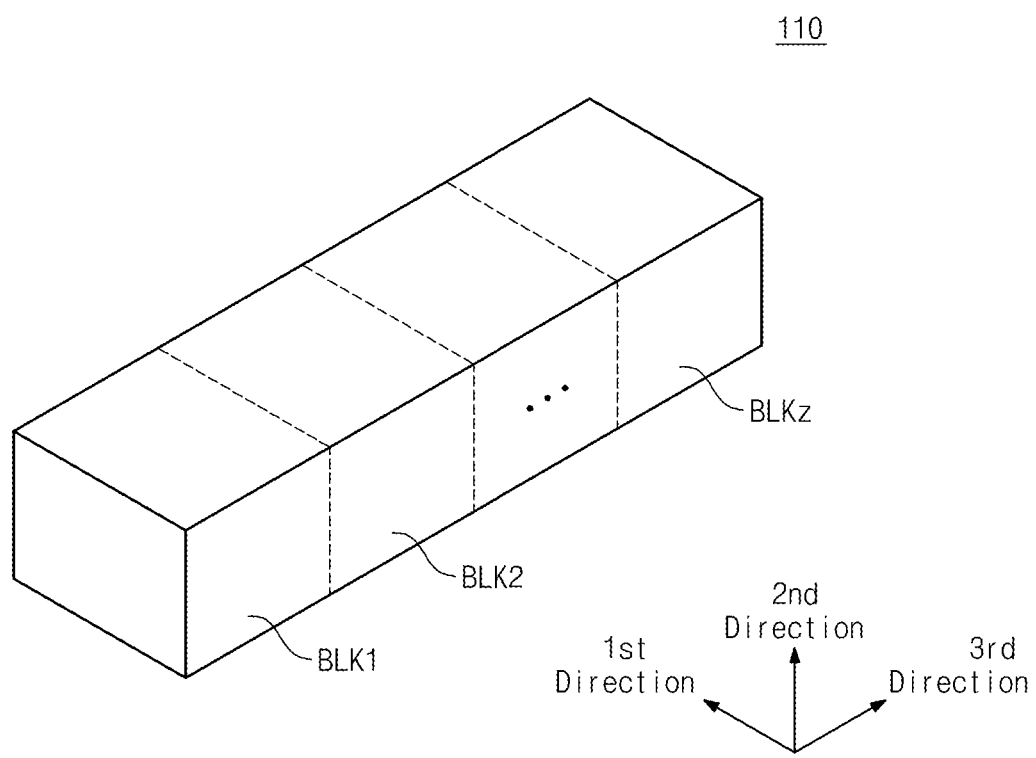
FIG. 2 is a block diagram illustrating a memory cell array of FIG. 1, according to embodiments of the inventive concept.

FIG. 2 is a block diagram illustrating the memory cell array 110 of FIG. 1, according to various embodiments. Referring to FIG. 2, the memory cell array 110 may include memory blocks BLK1-BLKz. Each memory block BLK has a three dimensional structure (or a vertical structure), which includes structures extending along first, second and third directions. Each memory block BLK includes multiple cell strings CS extending along the second direction. The cell strings CS are spaced a specific distance apart from one another in the first and third directions.

Each cell string CS is connected to a bit line BL, a string select line SSL, multiple word lines WL, a ground select line GSL and a common source line CSL. Each memory block BLK is connected to multiple bit lines BL, the multiple string select lines SSL, multiple word lines WL, the ground select line GSL and the common source line CSL. The memory blocks BLK1 to BLKz are described in more detail with reference to FIGS. 3 through 6, below.

The memory blocks BLK1 to BLKz are selected by the address decoder 120 illustrated in FIG. 1. The address decoder 120 is configured to select a memory block BLK corresponding to a received address ADDR among the memory blocks BLK1 to BLKz.

Figure 3:
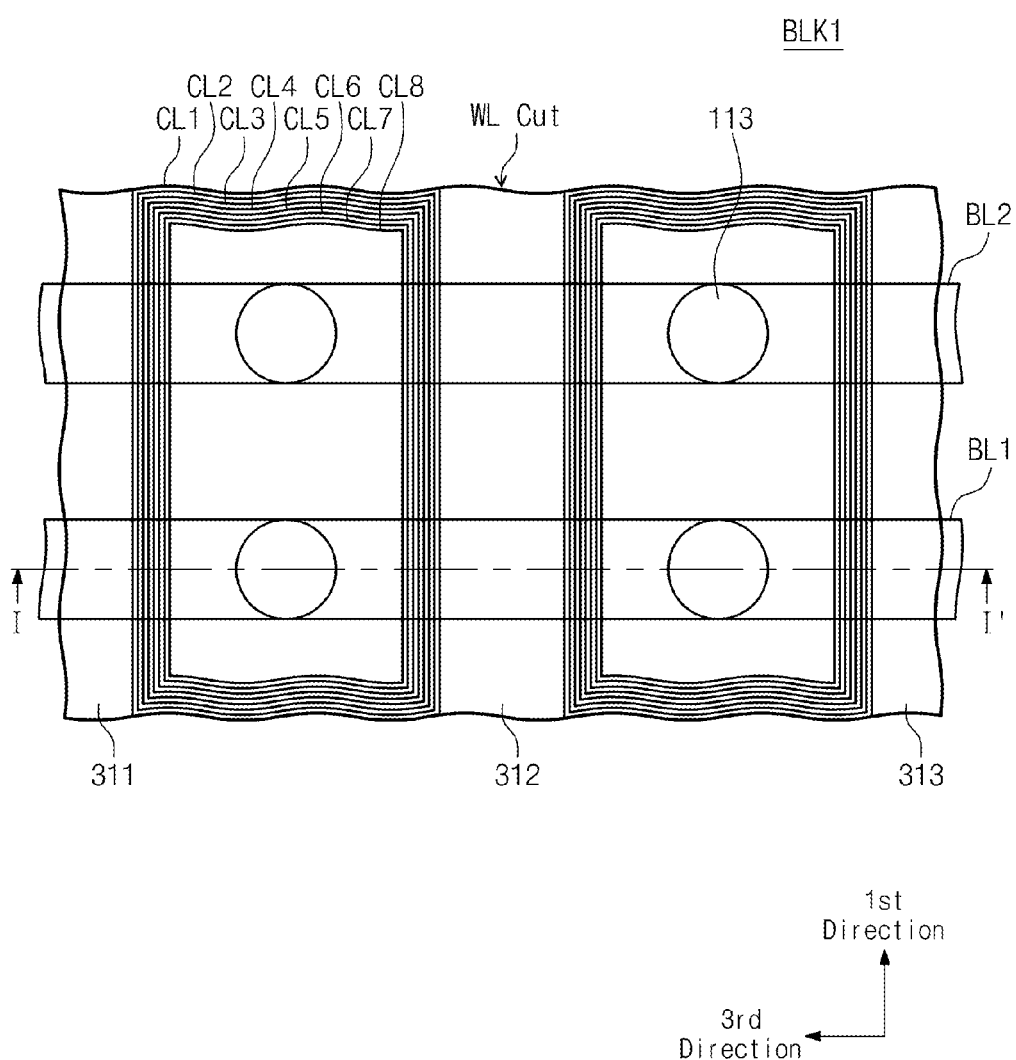
FIG. 3 is a top plan view illustrating a part of memory blocks of FIG. 2, according to embodiments of the inventive concept.
Figure 4:
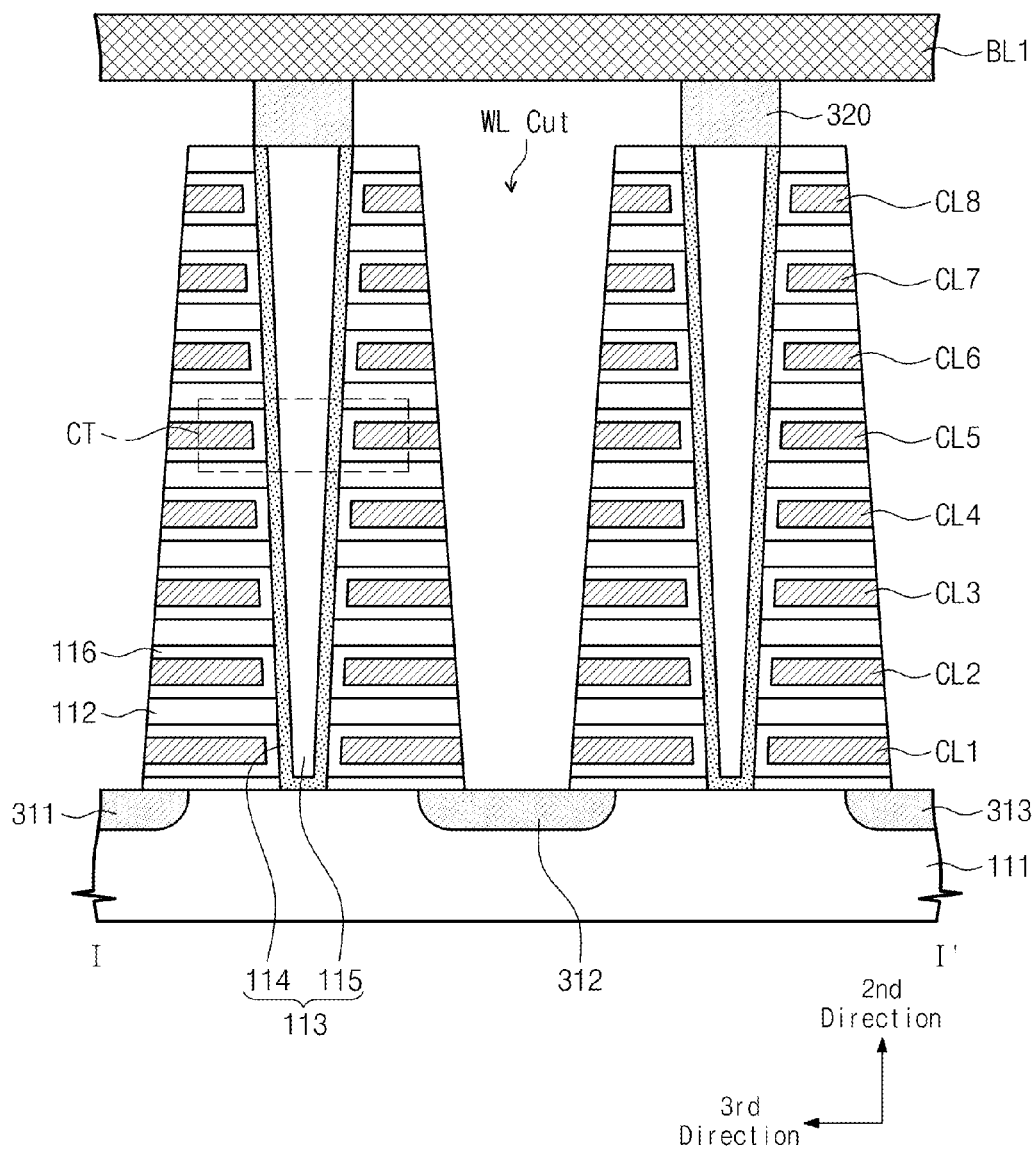
FIG. 4 is a cross sectional view taken along the line I-I' of FIG. 3, according to embodiments of the inventive concept.

FIG. 3 is a top plan view illustrating a part of memory block BLK1, representative of the memory blocks BLK1 to BLKz of FIG. 2, according to various embodiments. More particularly, FIG. 3 is a top plan view of conductive layers of one memory block BLK1. FIG. 4 is a cross-sectional view taken along the line I-I' of FIG. 3, according to various embodiments. Referring to FIGS. 3 and 4, the memory block BLK1 includes structures extending along the first and third directions.

The illustrative memory block BLK1 includes substrate 111, which may be a well of first conductivity type. For example, the substrate 111 may be a P-well, in which a third group element, such as boron, is implanted. The substrate 111 also may be a pocket P-well provided in an N-well. Hereinafter, it is assumed that the substrate 111 is a P-well (or a pocket P-well). However, the substrate 111 is not limited to the P-conductivity type, in various configurations.

Doping regions 311-313 extend in the first direction along the substrate 111, and are spaced a specific distance apart from one another along the third direction on the substrate 111. The doping regions 311-313 are sequentially defined as first doping region 311, second doping region 312 and third doping region 313.

Each of the first through third doping regions 311-313 has a second conductivity type different from the conductivity type of the substrate 111. For example, the first through third doping regions 311-313 may have an N-conductivity type. Hereinafter, it is assumed that the first through third doping regions 311-313 have an N-conductivity type. However, the first through third doping regions 311-313 are not limited to the N-conductivity type in various configurations.

Layers of insulating material 112 are sequentially provided on the substrate 111 in the second direction (i.e., perpendicular to the substrate 111), extending between adjacent doping regions of the first through third doping regions 311-313. The insulating materials 112 may be spaced a specific distance apart from one another along the second direction. The insulating materials 112 extend along the first direction. The insulating materials 112 may include any of a variety of insulating materials, such as an oxide. A thickness of insulating material 112 which is in contact with the substrate 111 is smaller than thicknesses of the other insulating materials 112.

Between the adjacent insulating materials 112 among the first through third doping regions 311-313, multiple pillars 113 are sequentially provided along the first direction, and penetrating the insulating materials 112 in the second direction. The pillars 113 penetrate the insulating materials 112 to enable contact with the substrate 111.

Each of the pillars 113 may include one or more materials, such as a channel layer 114 and an internal material 115, for example. The channel layer 114 of each of the pillars 113 may be formed of a semiconductor material (e.g., silicon) having a first conductivity type. For purpose of illustration, it is assumed that the channel layer 114 of each of the pillars 113 includes P-type silicon. However, the channel layer 114 of each of the pillars 113 is not limited to include P-type silicon, and may include another conductivity type or an intrinsic semiconductor having no conductivity type, for example. An internal material 115 of the pillars 113 may be an insulating material, such as silicon oxide. The internal material 115 of each of the pillars 113 may include an air gap.

An insulating layer 116 is provided on exposed surfaces of the insulating materials 112 and the pillars 113, between adjacent insulating materials 112. A thickness of the insulating layer 116 may be less than half the distance between the insulating materials 112. That is, a material different from the insulating material 112 and the insulating layer 116 may be provided between the insulating layer 116 provided on a bottom surface of the an insulating material 112 and the insulating layer 116 provided on a top surface of a lower insulating material 112.

Between adjacent doping regions among the first through third doping regions 311-313, conductive materials CL1-CL8 are provided on exposed surfaces of the insulating layers 116. The conductive materials CL1-CL8 extend in the first direction between adjacent insulating layers 116, e.g., between an insulating layer 116 on a bottom surface of an upper insulating material 112 and an insulating layer 116 on a top surface of a lower insulating material 112. The conductive materials CL1-CL8 may be divided by a word line cut on the doping regions 311-313. The conductive materials CL1-CL8 may include metallic conductive material and/or non-metallic conductive material, such as poly silicon.

The insulating layer 116 provided on a top surface of the uppermost insulating material 112 may be removed. Also, the insulating layer 116 provided on a side of the insulating materials 112 facing the pillar 113 may be removed.

Multiple drains 320 are provided on the pillars 113. The drains 320 may include semiconductor material (e.g., silicon) having a second conductivity type. For example, the drains 320 may include semiconductor material having an N-conductivity type (e.g., silicon). For purpose of illustration, it is assumed that the drains 320 include N-conductivity type silicon. However, the drains 320 are not limited to include N-conductivity type silicon. The drains 320 may extend on a top surface of the channel layer 114 of the pillar 113.

Bit lines BL1 and BL2 are provided on the drains 320, extending in the third direction and being spaced apart a specific distance from each other in the first direction. The bit lines BL1 and BL2 are connected to the drains 320, for example, through contact plugs (not illustrated). The bit lines BL1 and BL2 may include metallic conductive material and/or non-metallic conductive material, such as polysilicon.

Rows and columns of the pillars 113 of the memory block BLK1 are defined. For example, rows of the pillars 113 are defined depending on whether the conductive materials CL1-CL8 are divided. In FIGS. 3 and 4, the conductive materials CL1-CL8 are divided with the doping region 312 as the center.

The pillars 113 combined through the conductive materials CL1-CL8 and the insulating layer 116 provided between the first doping region 311 and the second doping region 312 are defined to be first row pillars. The pillars 113 combined through the conductive materials CL1-CL8 and the insulating layer 116 provided between the second doping region 312 and the third doping region 313 are defined to be second row pillars.

Columns of the pillars 113 are defined according to the bit lines BL1 and BL2. The pillars 113 connected through the first bit line BL1 and the drain 320 are defined to be first column pillars. The pillars 113 connected through the second bit line BL2 and the drain 320 are defined to be second column pillars.

The locations of the conductive materials CL1-CL8 (i.e., heights above the substrate 111) are defined. That is, the conductive materials CL1-CL8 are defined to have first through eighth locations in order from the substrate 111. The first conductive material CL1 closest to the substrate 111 has a first and lowest location, and the eighth conductive material CL8 closest to the bit lines BL1 and BL2 has an eighth and highest location.

In FIGS. 3 and 4, the pillars 113 form multiple cell strings CS, together with the insulating layer 116 and conductive materials CL1-CL8. Each of the pillars 113 constitutes one cell string CS together with the insulating layer 116 and the adjacent conductive materials CL1-CL8.

On the substrate 111, the pillars 113 are disposed along a row direction (first direction) and a column direction (third direction). That is, the memory block BLK1 includes multiple cell strings CS disposed along a row direction and a column direction on the substrate 111. Each of the cell strings CS includes multiple cell transistor structures CT stacked along a direction perpendicular to the substrate 111 (second direction). The cell transistor structures CT will be described in more detail with reference to FIG. 5.

Figure 5:
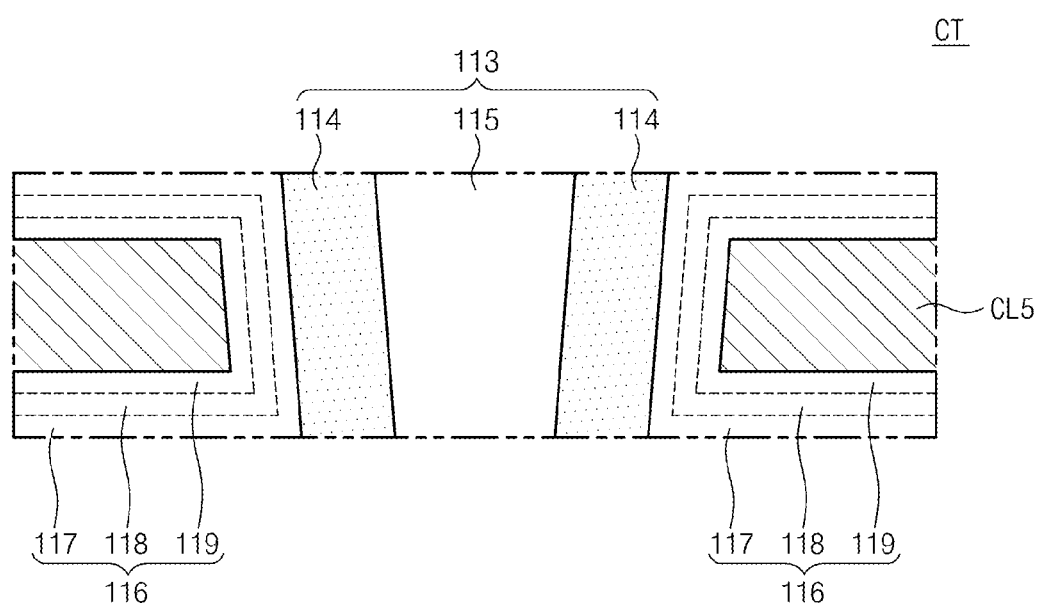
FIG. 5 is an enlarged view illustrating a cell transistor structure of FIG. 4, according to embodiments of the inventive concept.

FIG. 5 is an enlarged view illustrating a cell transistor structure CT of FIG. 4. Referring to FIGS. 3 through 5, the cell transistor structure CT is comprised of conductive material (here, CL5) having a specific height, a region of the pillar 113 corresponding to the conductive material (CL5) having a specific height and the insulating layer 116 provided between the conductive material (CL5) and the pillar 113. The insulating layer 116 includes first through third insulating sub-layers 117, 118 and 119.

In the cell transistor structure CT, the channel layer 114 of the pillar 113 may include P-type silicon which is the same as the substrate 111 or intrinsic silicon, for example. The channel layer 114 operates as a body in the cell transistor structure CT. The channel layer 114 is formed in a direction perpendicular to the substrate 111. The channel layer 114 of the pillar 113 is defined to operate as a vertical body. Also, a channel formed in the channel layer 114 of the pillar 113 is defined to be a vertical channel.

The first insulating sub-layer 117 adjacent to the pillar 113 operates as a tunneling insulating layer. For example, the first insulating sub-layer 117 adjacent to the pillar 113 may include a thermal oxide layer. The second insulating sub-layer 118 operates as a charge storage layer. For example, the second insulating sub-layer 118 may operate a charge capturing layer, and may include a nitride layer or a metal oxide layer (e.g., an aluminum oxide layer, a hafnium oxide layer, etc.). The third insulating sub-layer 119 adjacent to the conductive material CL5 operates as a blocking insulating layer. The third insulating sub-layer 119 may be formed as single or multiple layers. The third insulating sub-layer 119 may be a high dielectric layer (e.g., an aluminum oxide layer, a hafnium oxide layer, etc.), for example, having a dielectric constant higher than the first and second sub insulating layers 117 and 118. The first through third insulating sub-layers 117, 118 and 119 may constitute oxide-nitride-oxide (ONO) combination.

The conductive material CL5 operates as a gate (e.g., a control gate). For example, the conductive material CL5 may operate as a gate, the third insulating sub-layer 119 may operate as a blocking insulating layer, the second insulating sub-layer 118 may operate as a charge storage layer, the first insulating sub-layer 117 may operate as a tunneling insulating layer and the channel layer 114 operating as a vertical body may operate as a cell transistor. Thus, the conductive material CL5, the third insulating sub-layer 119, the second insulating sub-layer 118, the first insulating sub-layer 117 and the channel layer 114 may operate collectively as a charge capturing cell transistor.

In each of the cell strings CS, the cell transistor structures CT may be used for different purposes according to their respective locations. For example, in each of the cell strings CS, at least one cell transistor structure CT at an upper position may be used as a string select transistor SST, and at least one cell transistor structure CT at a lower portion may be used as a ground select transistor GST. In each of the cell strings CS, the remaining cell transistor structures CT may be used as memory cells or dummy memory cells, respectively.

The conductive materials CL1-CL8 extend along a row direction (first direction) to be combined with the plurality of pillars 113. That is, the conductive materials CL1-CL8 and the pillars 113 may constitute a plurality of cell strings CS spaced a specific distance apart from one another along the row direction. The conductive materials CL1-CL8 may constitute conductive lines connecting cell transistor structures CT having a same height of cell strings CS of a same row. The conductive materials CL1-CL8 may be used as a string select line SSL, a ground select line GSL, a word line WL or a dummy word line DWL depending on their positions.

Figure 6:
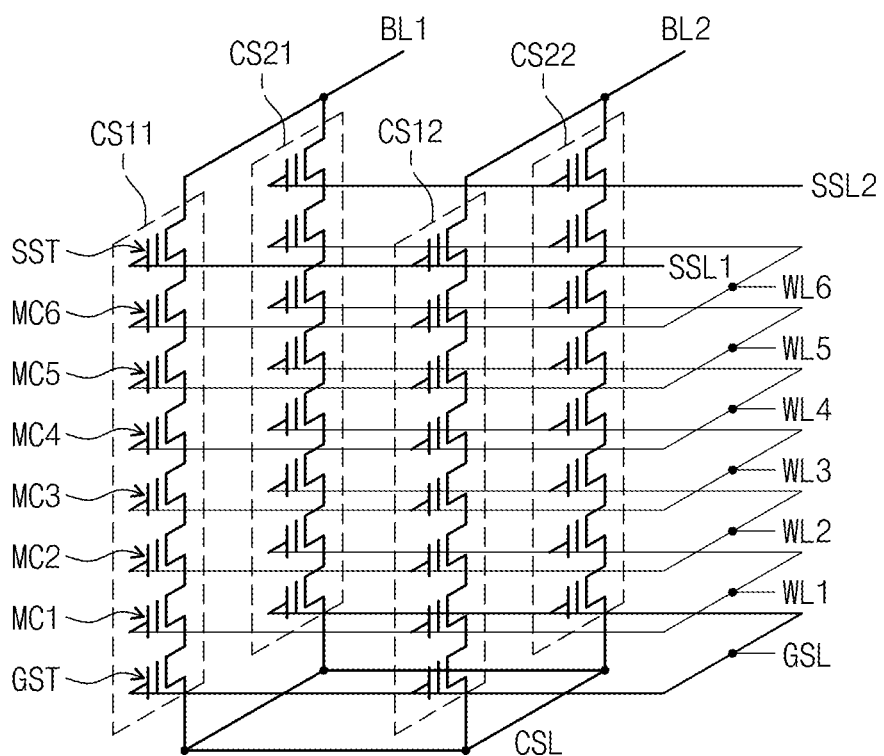
FIG. 6 is a circuit diagram illustrating an equivalent circuit of memory block described with reference to FIGS. 3 and 4, according to embodiments of the inventive concept.

FIG. 6 is a circuit diagram illustrating an equivalent circuit of memory block BLK1, described with reference to FIGS. 3 and 4, according to various embodiments. Referring to FIGS. 3 through 6, cell strings CS11 and CS21 are provided between the first bit line BL1 and the common source line CSL. Cell strings CS12 and CS22 are provided between the second bit line BL2 and the common source line CSL. The cell strings CS11, CS21, CS12 and CS22 correspond to the pillars 113 respectively.

In the cell strings CS CS11, CS21, CS12 and CS22, the cell transistor structures CT having a first (lowest) position may operate as ground select transistors GST. Cell strings in the same row share the ground select line GSL, cell strings of a different row share the ground select line GSL. The conductive materials CL1 in the first position are connected to one another to form the ground select line GSL.

In the cell strings CS CS11, CS21, CS12 and CS22, the cell transistor structures CT having second through sixth positions may operate as memory cells MC1-MC6. Memory cells MC in the same position (at the same height above the substrate 111) and corresponding to a same row share the word line WL, and memory cells MC at the same position and corresponding to a different row share the word line WL.

In the depicted example, the conductive materials CL2 in the second position are connected to one another in common to form a first word line WL1. The conductive materials CL3 in the third position are connected to one another in common to form a second word line WL2. The conductive materials CL4 in the fourth position are connected to one another in common to form a third word line WL3. The conductive materials CL5 in the fifth position are connected to one another in common to form a fourth word line WL4. The conductive materials CL6 in the sixth position are connected to one another in common to form a fifth word line WL5. The conductive materials CL7 in the seventh position are connected to one another in common to form a sixth word line WL6.

In the cell strings CS CS11, CS21, CS12 and CS22, the cell transistor structures CT in the eighth (highest) position may operate as string select transistors SST. Cell strings in the same row share the string select line SSL, cell strings in a different row share the string select line SSL. For example, first and second string lines SSL1 and SSL2 correspond to the conductive materials CL8 in the eighth position, respectively. That is, the pillars 113 of the cell strings may be defined by the string select lines SSL1 and SSL2. Hereinafter, string select transistors SST connected to the first string line SSL1 are defined to be first select transistors SST1, and string select transistors SST connected to the second string line SSL2 are defined to be second select transistors SST2.

The common source line CSL is connected to cell strings in common. For example, the first through third doping regions 311-313 are connected to one another to form the common source line CSL.

As depicted in FIG. 6, word lines WL at the same position (height) are connected to one another in common. Thus, when the word line WL having a specific position is selected, all of the cell strings connected to the selected word line WL are selected.

Cell strings of different rows are connected to a different string select line SSL. By selecting or unselecting the string select lines SSL1 and SSL2, among cell strings connected to a same word line WL, cell strings of an unselected row may be electrically separated from the bit line and cell strings of a selected row may be electrically connected to the bit line. That is, by selecting or unselecting the string select lines SSL1 and SSL2, rows of the cell strings CS may be selected. By selecting the bit lines BL1 and BL2, columns of the cell strings of selected row may be selected.

At least one of the word lines WL may be used as a dummy word line DWL. For example, a word line WL having a position (height) adjacent to the string select line SSL, a word line WL having a position adjacent to the ground select line GSL and a word line WL having a position between the string select line SSL and the ground select line GSL may each be used as a dummy word line DWL.

Conductive materials corresponding to at least two positions may constitute the string select lines SSL. For example, the conductive material CL7 in a seventh position and the conductive material CL8 in an eighth position may constitute the string select lines SSL, respectively. At this time, the conductive materials CL7 and CL8 having different heights (i.e., the seventh position and the eighth position) in the same row may be connected in common to constitute one string select line SSL. Likewise, conductive materials corresponding to at least two positions (heights) may constitute the ground select lines GSL. For example, the conductive material CL1 in a first position and the conductive material CL2 in a second position may be connected in common to constitute one ground select line GSL. The conductive materials CL1 in the first position may constitute two ground select lines GSL electrically separated from each other.

Figure 7:
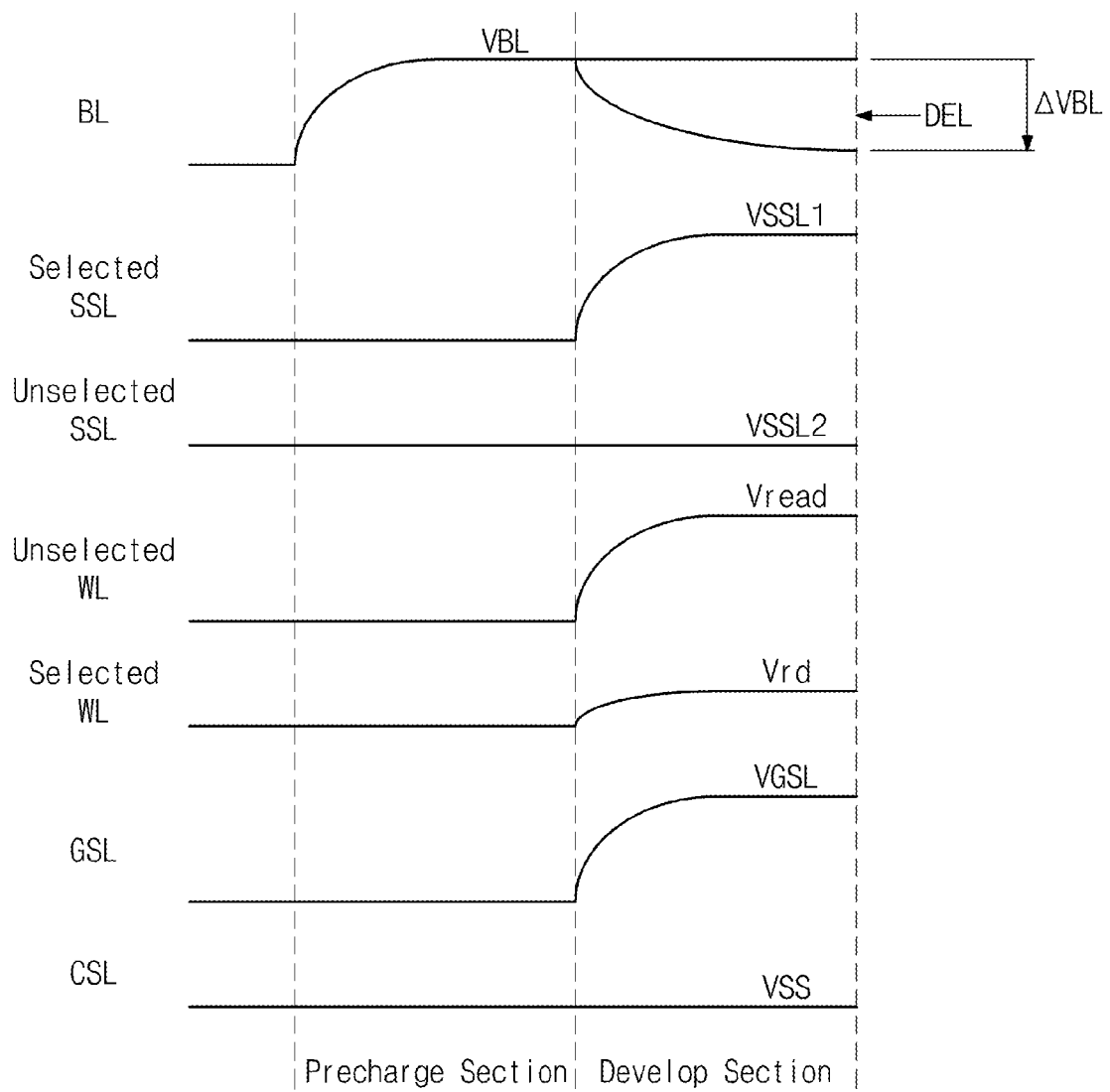
FIG. 7 is a timing diagram illustrating voltage changes further to a read operation of a memory block described with reference to FIGS. 3 through 6, according to embodiments of the inventive concept.

FIG. 7 is a timing diagram illustrating voltage changes occurring during performance of a read operation of memory block BLK1, described with reference to FIGS. 3 through 6. It is assumed that the cell strings CS11 and CS12 of a first row, that is, the first string select line SSL1 is selected and the third word line WL3 is selected.

Referring to FIGS. 3 through 7, in a precharge section, a bit line voltage VBL is provided to the bit lines BL1 and BL2. The bit line voltage VBL may be a power supply voltage VCC, for example. The bit line voltage VBL is provided to the bit lines BL1 and BL2 from the read and write circuit 130 of FIG. 1. When voltages of the bit lines BL1 and BL2 reach the bit line voltage VBL, the bit lines BL1 and BL2 may float.

In a develop section, voltages are applied for reading memory cells in a develop operation. During the develop operation, a first string select line voltage VSSL1 is applied to the selected string select line SSL1 and a second string select line voltage VSSL2 is applied to an unselected string select line SSL2. The first string select line voltage VSSL1 has a level that can turn on the selected string select transistors SST1. The first string select line voltage VSSL1 may have the same level as the unselect read voltage Vread, for example. By the first string select line voltage VSSL1, a vertical channel is formed in a region of the channel layer 114 corresponding to the conductive material CL8 in an eighth position of a first row. The second string select line voltage VSSL2 has a level that can turn off the unselected sting select transistors SST2. The second string select line voltage VSSL2 may be a ground voltage VSS, for example. By the second string select line voltage VSSL2, a vertical channel is not formed in a region of the channel layer 114 corresponding to the conductive material CL8 in the eight position of a second row.

An unselect read voltage Vread is applied to unselected word lines WL1, WL2 and WL4-WL6. The unselect read voltage Vread has a level that can turn on the memory cells MC regardless of data stored in the memory cells MC. The unselect read voltage Vread is a fixed voltage. By the unselect read voltage Vread, a vertical channel is formed in a region of the channel layer 114 corresponding to the conductive materials CL2, CL3 and CL5-CL7 in the second, third and fifth through seventh positions, respectively.

A select read voltage Vrd is applied to the selected word line WL3. The select read voltage Vrd has a level that can discriminate data stored in the memory cells MC. The select read voltage Vrd may have a level between threshold voltages corresponding to logic states of the memory cells MC. A vertical channel may be formed or not be formed in a region of the cannel layer 114 corresponding to the conductive material CL3 in the third position depending on threshold voltages of the selected memory cells MC3.

A ground select line voltage VGSL is applied to the ground select line GSL. The ground select line voltage VGSL has a level that can turn on ground select transistors GST. The ground select line voltage VGSL may have the same level as the unselect read voltage Vread. A vertical channel is formed in a region of the channel layer 114 corresponding to the conductive material CL1 in a first position by the ground select line voltage VGSL. Also, a horizontal channel is formed in a region of the substrate 111 corresponding to the conductive material CL1 in a first position by the ground select line voltage VGSL.

The first conductive material CL1 is adjacent to the substrate 111. An electric field generated by the ground select line voltage VGSL applied to the first conductive material CL1 may affect the substrate 111. By the ground select line voltage VGSL applied to the first conductive material CL1, a channel is formed in a region of the substrate 111 corresponding to the first conductive material CL1. Hereinafter, a channel formed in the substrate 111 is defined to be a horizontal channel.

The first conductive material CL1 extends onto a part of the doping regions 311-313. Thus, the horizontal channel is connected to the doping regions 311-313. Horizontal channels generated by the first conductive materials CL1 of a first row are connected to the first and second doping regions 311 and 312. Horizontal channels generated by the first conductive materials CL1 of a second row are connected to the second and third doping regions 312 and 313.

Thus, when the ground select line voltage VGSL is applied to the first conductive material CL1, the vertical channels and the doping regions 311-313 corresponding to the first conductive material CL1 are connected to one another through the horizontal channels. That is, a channel is formed in the ground select transistor GST, and the channel of the ground select transistor GST is connected to the common source line CSL. A ground voltage VSS is applied to the doping regions 31-313 operating as the common source line CSL.

After the bit lines BL1 and BL2 are charged to the bit line voltage VBL, they enter a floating state. The selected string select transistors SST1, the unselected word lines WL, WL2 and WL4-WL6 and the ground select transistors GST are turned on. Thus, a channel is formed in the cell strings CS11 and CS12 of a first row depending on threshold voltages of memory cells MC3 connected to the selected word line WL3.

It is assumed that among the selected memory cells MC3, a threshold voltage of the memory cell MC3 of the cell string CS11 of a first row and a first column is lower than the select read voltage Vrd. Also, it is assumed that among the selected memory cells MC3, a threshold voltage of the memory cell MC3 of the cell string CS12 of a first row and a second column is higher than the select read voltage Vrd.

At this time, a channel is formed in the cell string CS11 of a first row and a first column. That is, the first bit line BL1 is electrically connected to the doping regions 311-313 operating as the common source line CSL through a vertical channel formed in the cell string CS11 and a horizontal channel formed on the substrate 111. A cell current flows from the first bit line BL1 to the common source line CSL. That is, a bit line voltage VBL charged in the first bit line BL1 is discharged through the common source line CSL. Thus, as time passes, a voltage of the first bit line BL1 is lowered from the bit line voltage VBL. For example, the voltage of the first bit line BL1 is lowered by a level ($\Delta$VBL).

A channel is not formed in the cell string CS12 of a first row and a second column. Thus, even as time passes, a voltage of the second bit line BL2 maintains the bit line voltage VBL.

After the develop operation, data is discriminated. When a voltage of the bit line BL is higher than a discrimination level DEL, a threshold voltage of the selected memory cell MC3 is discriminated to be higher than the select read voltage Vrd. That is, the selected memory cell MC3 of a first row and a second column is discriminated to have a logic state corresponding to a threshold voltage higher than the select read voltage Vrd. When a voltage of the bit line BL is lower than the discrimination level DEL, a threshold voltage of the selected memory cell MC3 is discriminated to be lower than the select read voltage Vread. That is, the memory cell MC3 of a first row and a first column is discriminated to have a logic state corresponding to a threshold voltage lower than the select read voltage Vread.

Figure 8:
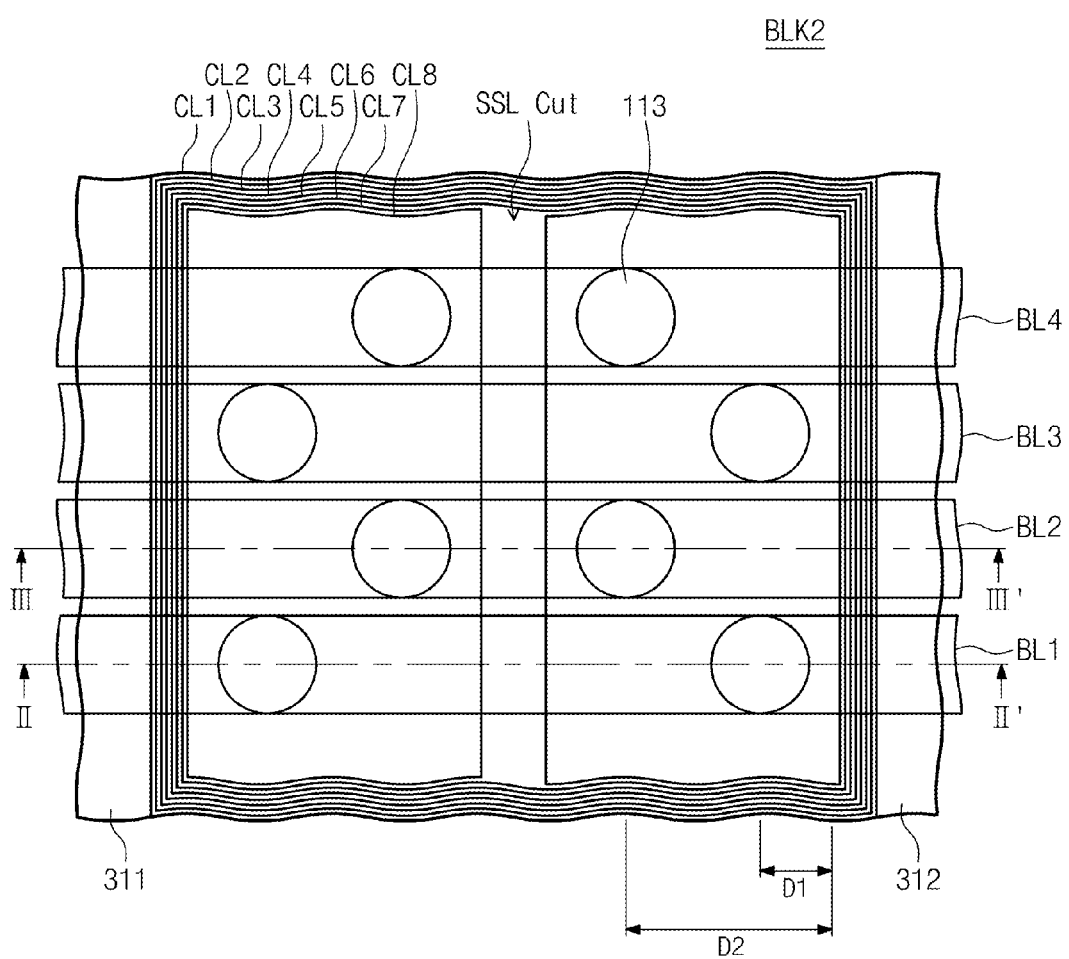
FIG. 8 is a top plan view illustrating part of memory block, according to a first embodiment of the inventive concept.
Figure 9:
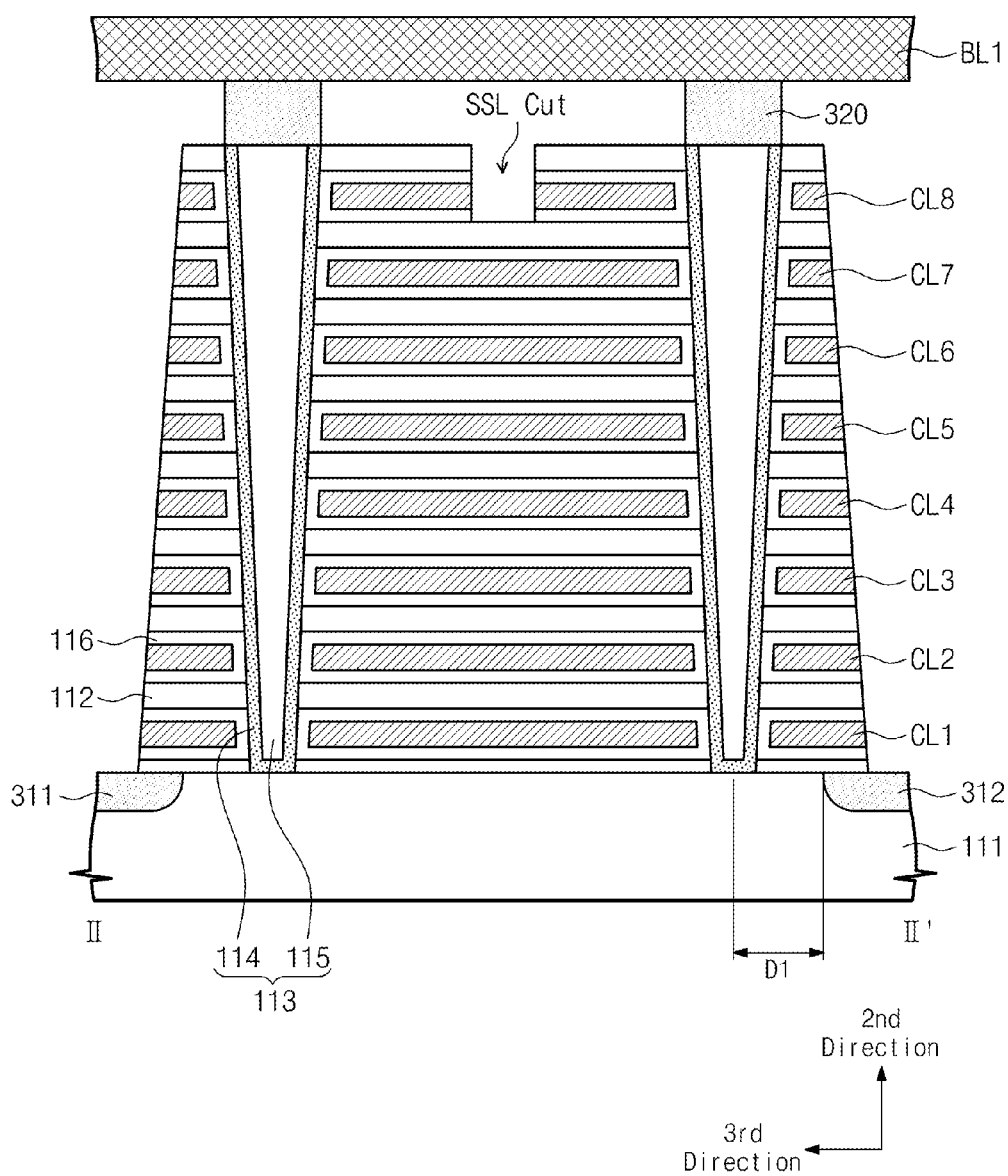
FIG. 9 is a cross sectional view taken along the line II-II' of FIG. 8, according to a first embodiment of the inventive concept.
Figure 10:
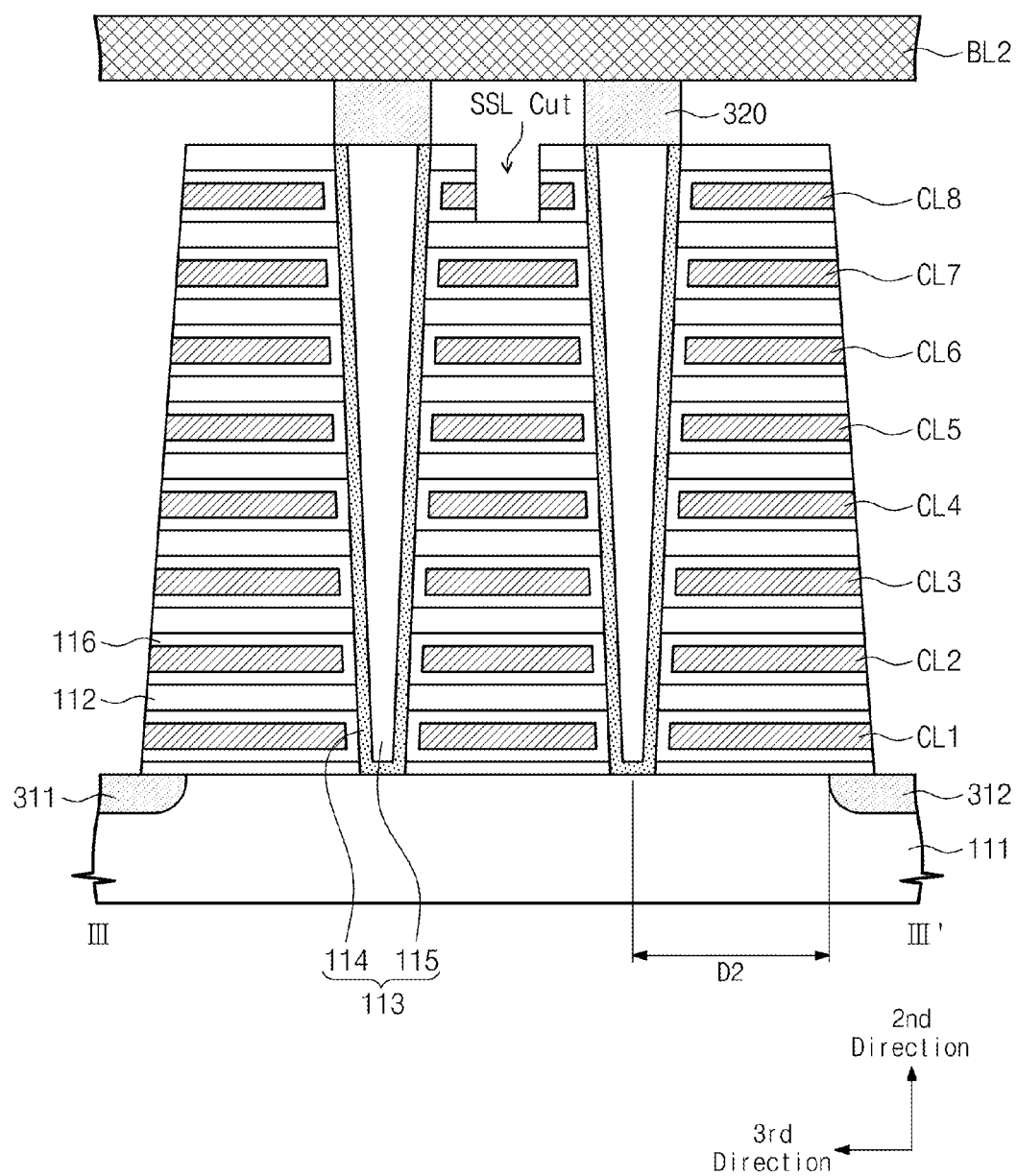
FIG. 10 is a cross sectional view taken along the line III-III' of FIG. 8, according to a first embodiment of the inventive concept.

FIG. 8 is a top plan view illustrating a part of memory block BLK2, according to a first embodiment. More particularly, FIG. 8 is a top plan view of conductive layers of memory block BLK2, according to a first embodiment. FIG. 9 is a cross sectional view taken along the line II-II' of FIG. 8, and FIG. 10 is a cross sectional view taken along the line III-III' of FIG. 8, according to a first embodiment.

As described with reference to FIGS. 3 through 6, the insulating materials 112, the pillars 113, the insulating layers 116 and the conductive materials CL1-CL8 are provided on the substrate 111 between the adjacent doping regions 311 and 312.

According to the memory block BLK1 described with reference to FIGS. 3 through 6, one pillar 113 is provided to one column between adjacent doping regions. In comparison, according to the memory block BLK2 in accordance with a first embodiment, two pillars 113 are provided to one column between adjacent doping regions 311 and 312.

Also, according to the memory block BLK1 described with reference to FIGS. 3 through 6, one conductive material is provided at a specific position (height) between adjacent two doping regions. In comparison, according to the memory block BLK2 in accordance with the first embodiment, the conductive materials CL8 in an eighth position (height) is separated by a string select line cut SSL cut between two adjacent doping regions 311 and 312. The eighth conductive materials CL8 separated by the string select line cut SSL cut constitute the string select lines SSL.

Conductive materials corresponding to at least two positions (e.g., the seventh and eighth positions) may constitute the string select lines SSL. At this time, a depth of the string select line cut SSL cut may vary. For instance, the string select line cut SSL cut may deepen to separate the seventh conductive material CL7.

As described with reference to FIGS. 3 through 7, the other conductive materials CL1-CL7 may constitute word lines WL, ground select lines GSL and/or dummy word lines DWL depending on their positions.

As described with reference to FIGS. 3 through 7, rows of the pillars 113 constituting the cell strings are defined depending on whether the conductive materials CL1-CL8 are separated or the string select lines SSL. The pillars 113 provided between the string select line cut SSL cut and the first doping region 311 are defined to first row pillars 113. The pillars 113 provided between the string select line cut SSL cut and the second doping region 312 are defined to second row pillars 113.

An equivalent circuit of the memory block BLK2 in accordance with the first embodiment is substantially identical to an equivalent circuit illustrated in FIG. 6, except that the cell strings are illustrated over a second row and a fourth column. Thus, the description will not be repeated.

According to the memory block BLK1 described with reference to FIGS. 3 through 6, the distance between the pillars 113 corresponding to one row and the doping regions adjacent to the pillars 113 remains constant. In the memory block BLK2, the pillars 113 corresponding to one row are provided according to a specific pattern. The distance between the pillars corresponding to one row and the doping regions 311 and 312 varies depending on a specific pattern. In FIG. 9, the distance between each of the pillars of a first column and the closest adjacent doping regions 311 and 312 is defined as a first distance D1. In FIG. 10, a distance between each of the pillars of a second column and the closest adjacent doping regions 311 and 312 is defined as a second distance D2. The first distance D1 is shorter than the second distance D2.

The respective distances between the cell strings and the doping regions 311 and 312 may be the first distance D1 or the second distance D2. Thus, the bit lines BL1-BL4 may be divided into two groups depending on the distance between each of the cell strings and the doping regions 311 and 312. For example, the bit lines BL1-BL4 may be divided into a first group, in which a distance between each of the cell strings and the doping regions 311 and 312 is the first distance D1, and a second group, in which a distance between each of the cell strings and the doping regions 311 and 312 is the second distance D2. The first group includes odd bit lines BL1 and BL3, and the second group includes even bit lines BL2 and BL4. Hereinafter, the bit lines BL1 and BL3 of the first group are referred to as close or near bit lines since they are closer (i.e., the first distance D1) to the doping regions 311 and 312, and the bit lines BL2 and BL4 of the second group are referred to as distant or far bit lines since they are farther (i.e., the second distance D2) from the doping regions 311 and 312.

When a read operation is performed, the bit line voltage VBL charged in the bit lines BL1-BL4 is discharged. A cell current flows from the bit lines BL1-BL4 to the common source line CSL through vertical channels of the cell strings and horizontal channels on the substrate 111.

The length of the horizontal channels corresponding to the near bit lines BL1 and BL3 is the first distance D1, and the length of the horizontal channels corresponding to the far bit lines BL2 and BL4 is the second distance D2. The first distance D1 is shorter than the second distance D2. Thus, a resistance of the horizontal channels corresponding to the near bit lines BL1 and BL3 may be smaller than a resistance of the horizontal channels corresponding to the far bit lines BL2 and BL4. When a read operation is performed, the quantity of cell currents being discharged from the near bit lines BL1 and BL3 may be larger than the quantity of cell currents being discharged from the far bit lines BL2 and BL4.

If the quantities of cell currents are different from each other, during the develop operation, a voltage change of the near bit lines BL1 and BL3 and a voltage change of the far bit lines BL2 and BL4 are different from each other. For instance, a voltage change of the near bit lines BL1 and BL3 may be greater than a voltage change of the far bit lines BL2 and BL4. Thus, when a read operation is performed, an error may occur.

To prevent the problem described above, the nonvolatile memory device in accordance with embodiments of the inventive concept controls levels of the bit line voltages being provided to the bit lines BL1-BL4 in a precharge section of the read operation.

Figure 11:
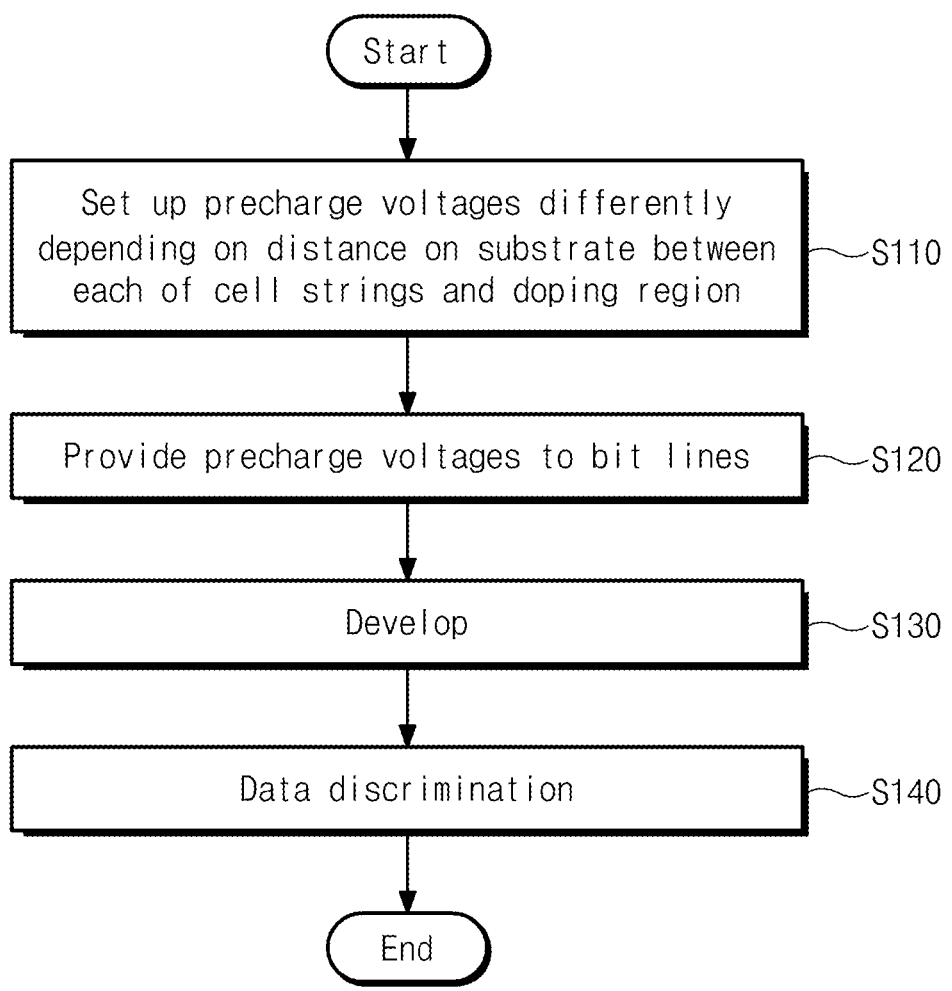
FIG. 11 is a flow chart illustrating a read method, according to embodiments of the inventive concept.

FIG. 11 is a flow chart illustrating a read method, according to various embodiments. Referring to FIGS. 8 through 11, in step S110, precharge voltages are set to be different from one another depending on the distance on the substrate 111 between the cell strings and the doping regions 31 and 312, respectively. In step S120, the precharge voltages are provided to the bit lines. A develop operation is performed in step S130, and the data is discriminated in step S140.

Figure 12:
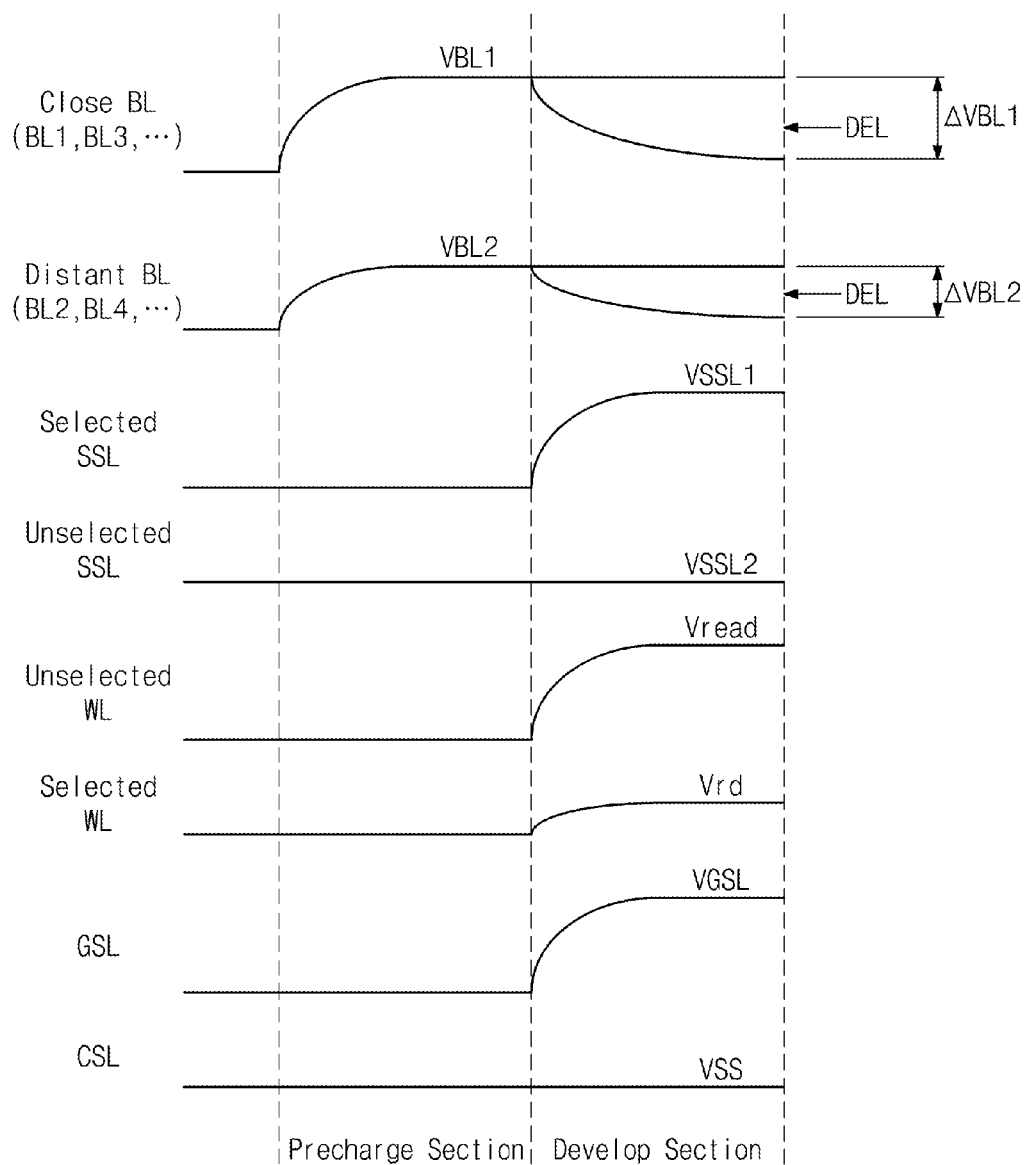
FIG. 12 is a timing diagram illustrating voltage changes further to the read method of FIG. 11, according to embodiments of the inventive concept.

FIG. 12 is a timing diagram illustrating voltage changes in accordance with the read method of FIG. 11, according to various embodiments. Referring to FIGS. 8 through 12, in a precharge section, a first bit line voltage VBL1 is provided to the near bit lines BL1 and BL3 and a second bit line voltage VBL2 is provided to the far bit lines BL2 and BL4. The level of the first bit line voltage VBL1 is higher than the level of the second bit line voltage VBL2.

In a develop section, voltages of the string select lines SSL1 and SSL2, the word lines WL1-WL6, the ground select line GSL and the common source line CSL are controlled. The voltages of the string select lines SSL1 and SSL2, the word lines WL1-WL6, the ground select line GSL and the common source line CSL are controlled using the same method as that described with reference to FIG. 7. Thus, the description will not be repeated.

The quantity of cell currents being discharged from the near bit lines BL1 and BL3 is larger than the quantity of cell currents being discharged from the far bit lines BL2 and BL4. That is, in the develop section, a first voltage change $\Delta VBL1$ of the near bit lines BL1 and BL3 is greater than a second voltage change $\Delta VBL2$ of the far bit lines BL2 and BL4.

The first bit line voltage VBL1 is controlled considering the discrimination level DEL and the first voltage change $\Delta VBL1$, so that a read margin is improved. For instance, when the selected memory cell MC is turned off, the difference between a level of the first bit line voltage VBL1 and the discrimination level DEL acts as a margin (hereinafter referred to as an "off-margin"), discriminating the selected memory cell MC to be a turn-off state. Also, when the selected memory cell MC is turned on, the difference between a level of voltage that a voltage of the near bit lines BL1 and BL3 is reduced by the first voltage change $\Delta VBL1$ from the first bit line voltage VBL1, and the discrimination level DEL acts as a margin (hereinafter referred to as an "on-margin") discriminating the selected memory cell MC to be a turn-on state.

The first bit line voltage VBL1 and the discrimination level DEL are set so that an off margin and an on margin of the memory cells MC corresponding to the near bit lines BL1 and BL3 are optimized to improve a read margin.

The second bit line voltage VBL2 is controlled considering the discrimination level DEL and the second voltage change $\Delta BL2$ so that a read margin is improved. When the selected memory cell MC is turned on, a voltage of the far bit lines BL2 and BL4 is reduced by the second voltage change $\Delta BL2$. The second voltage change $\Delta BL2$ is smaller than the first voltage change $\Delta VBL1$.

Thus, when the far bit lines BL2 and BL4 are precharged by the first bit line voltage VBL1, which is the same as the voltage precharging the near bit lines BL1 and BL3, an on-margin of memory cells MC corresponding to the far bit lines BL2 and BL4 is reduced. If only the on-margin is reduced while the off-margin is maintained, the read margin of the memory cells MC is reduced. Therefore, the probability increases that the memory cells MC corresponding to the far bit lines BL2 and BL4 will be misjudged to be in a turn-on state.

The second bit line voltage VBL2 is set so that an off-margin and an on-margin of memory cells corresponding to the far bit lines BL2 and BL4 are optimized to improve the read margin. According to a first embodiment, in the precharge section, the second bit line voltage VBL2 provided to the far bit lines BL2 and BL4 has a lower level than the first bit line voltage VBL1.

As the second bit line voltage VBL2 is reduced, an off-margin of the memory cells MC corresponding to the far bit lines BL2 and BL4 is reduced and an on-margin of the memory cells MC corresponding to the far bit lines BL2 and BL4 increases. Thus, an on-margin reduction due to the difference in length of the horizontal channels may be compensated for by setting the second bit line voltage VBL2 to be lower than the first bit line voltage VBL1.

Figure 13:
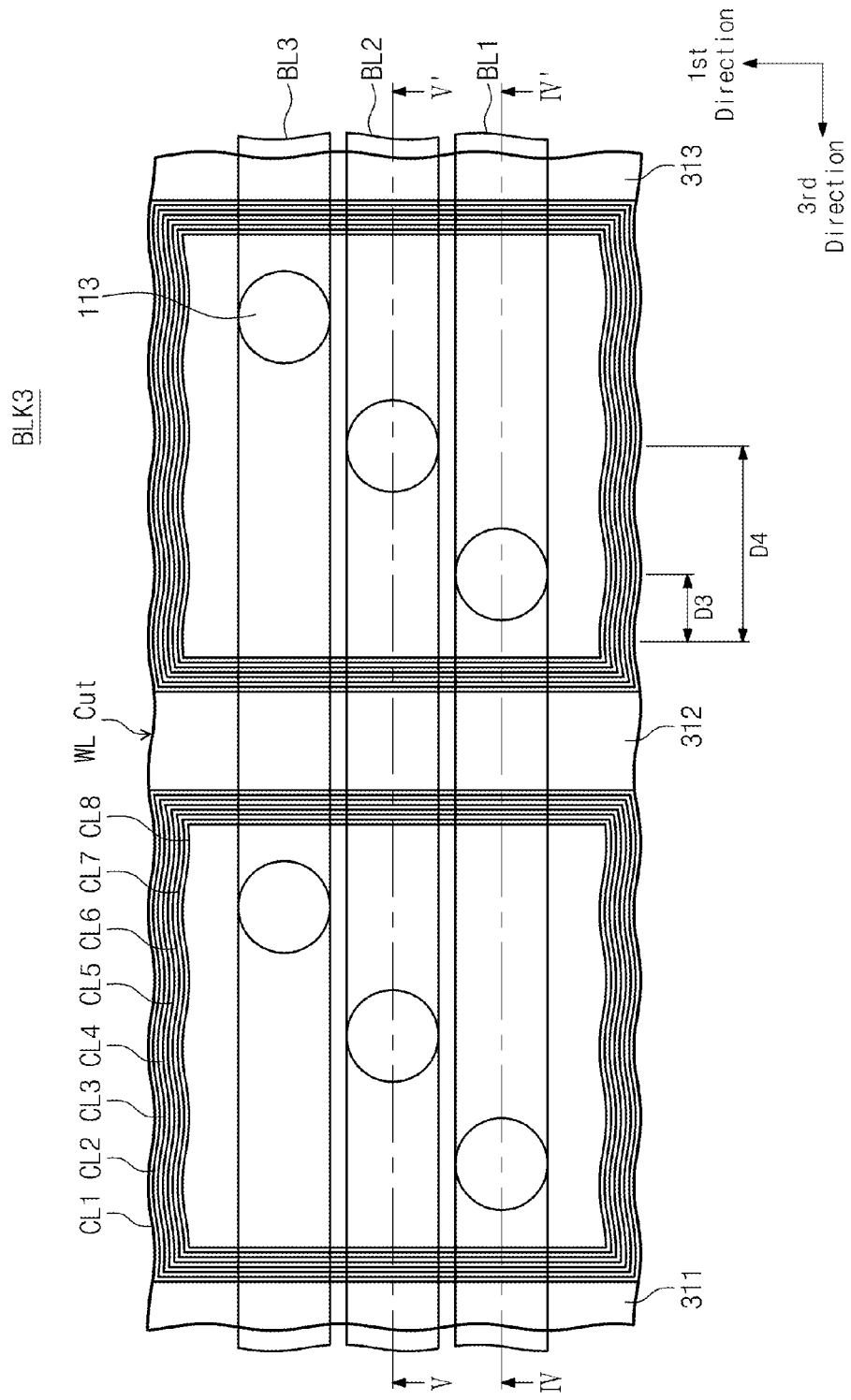
FIG. 13 is a top plan view illustrating a part of memory block, according to a second embodiment of the inventive concept.
Figure 14:
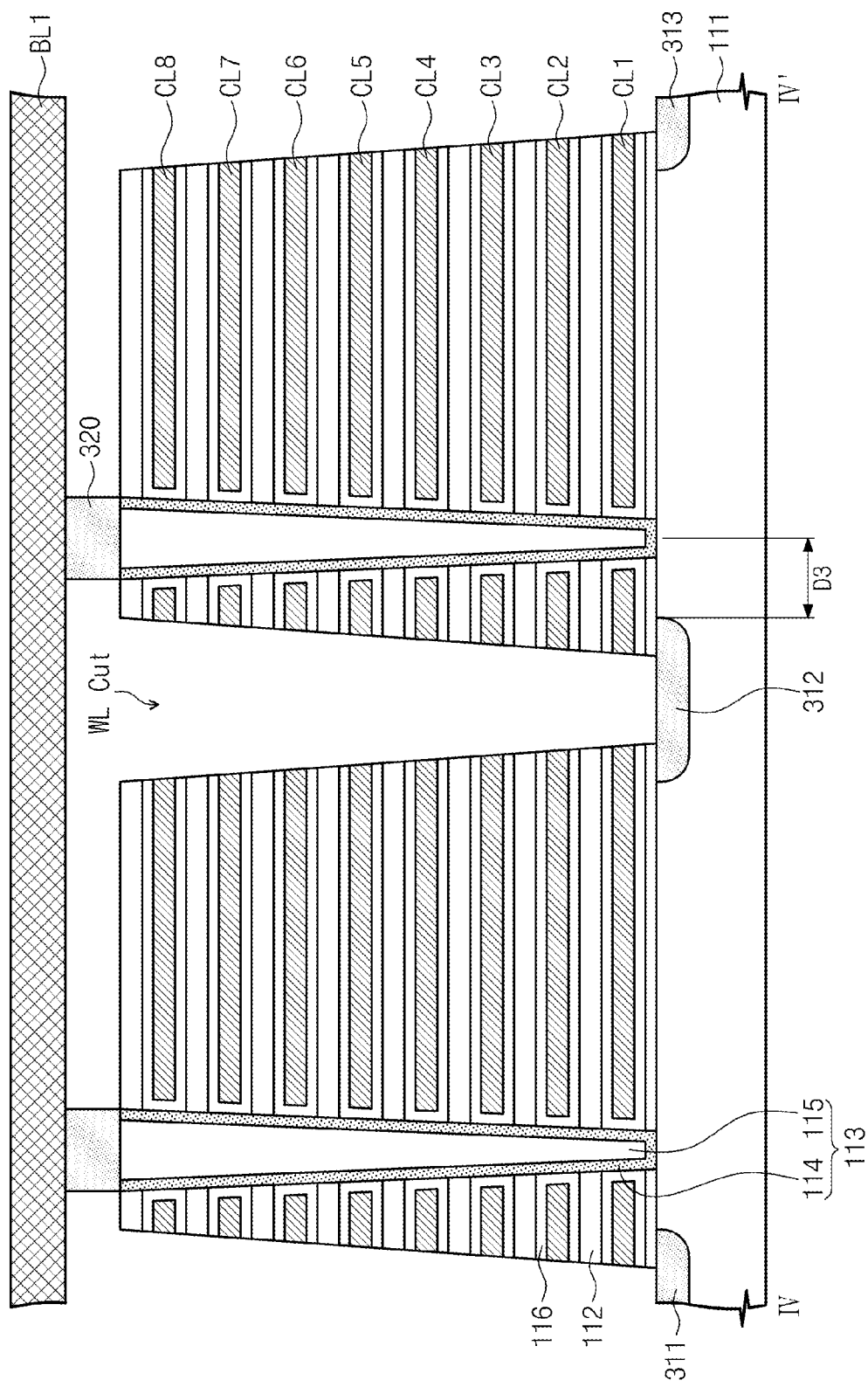
FIG. 14 is a cross sectional view taken along the line IV-IV' of FIG. 13, according to a second embodiment of the inventive concept.
Figure 15:
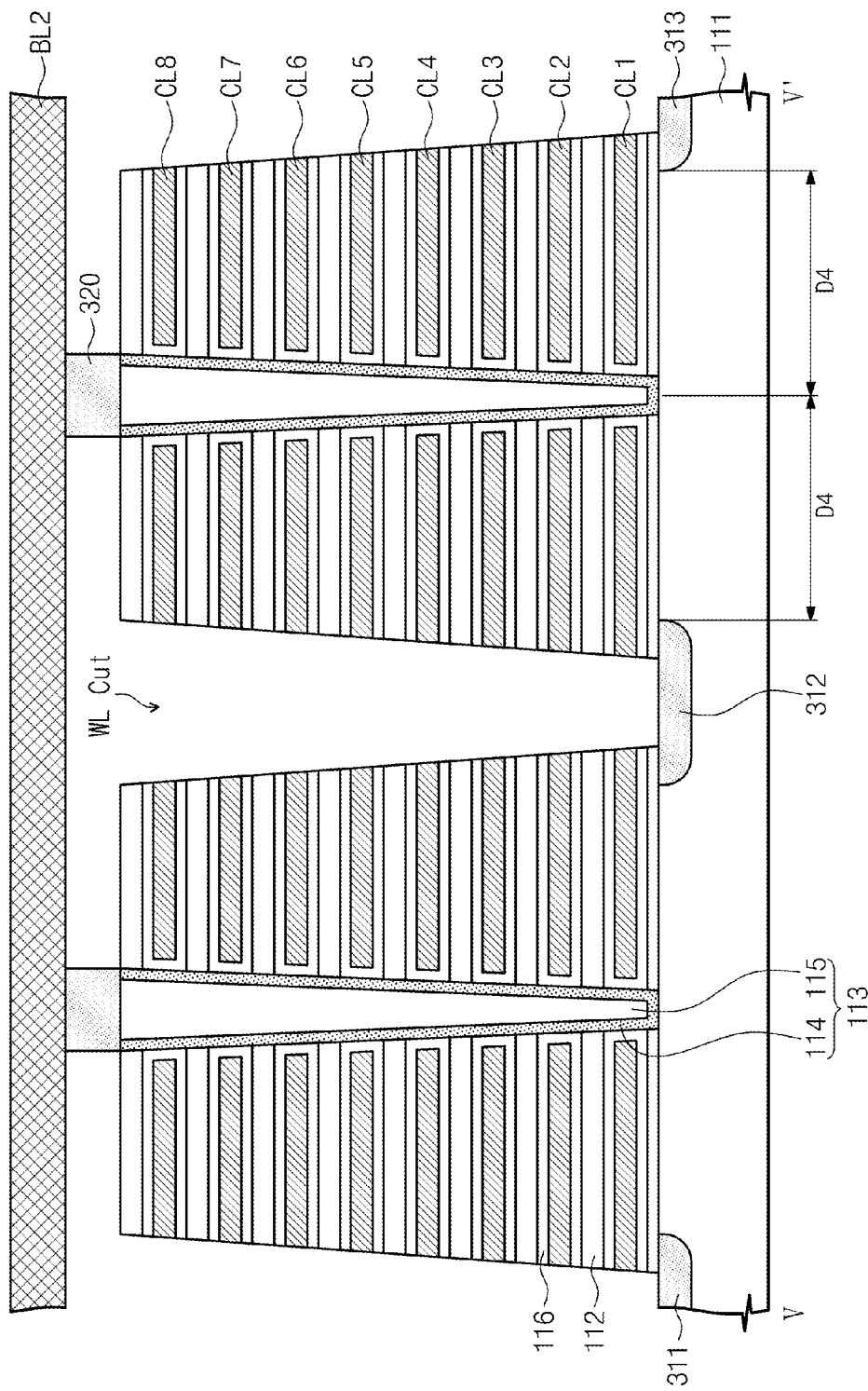
FIG. 15 is a cross sectional view taken along the line V-V' of FIG. 13, according to a second embodiment of the inventive concept.

FIG. 13 is a top plan view illustrating a part of memory block BLK3, according to a second embodiment. More particularly, FIG. 13 is a top plan view of conductive layers of the memory block BLK3. FIG. 14 is a cross sectional view taken along the line IV-IV' of FIG. 13, and FIG. 15 is a cross sectional view taken along the line V-V' of FIG. 13, according to the second embodiment.

As described with reference to FIGS. 3 through 6, the insulating materials 112, the pillars 113, the insulating layers 116 and the conductive materials CL1-CL8 are provided between adjacent doping regions of the doping regions 311-313. On the doping region 312, the conductive materials CL1-CL8 are separated by a word line cut WL cut.

As described with reference to FIGS. 3 through 7, rows of pillars constituting cell strings are defined depending on whether the conductive materials CL1-CL8 are separated, or the string select lines SSL. Pillars between the first and second doping regions 311 and 312 are defined to be first row pillars, and pillars between the second and third doping regions 312 and 313 are defined to be second row pillars.

An equivalent circuit of the memory block BLK3 in accordance with the second embodiment is substantially identical to an equivalent circuit illustrated in FIG. 6, except that the cell strings are illustrated over a second row and a third column. Thus, the description will not be repeated.

According to the memory block BLK1 described with reference to FIGS. 3 through 6, the distance between the pillars 113 corresponding to one row and the doping regions adjacent to the pillars 113 remains constant. In FIGS. 13 through 15, the pillars 113 corresponding to one row are provided according to a specific pattern. The distance between the pillars corresponding to one row and the doping regions 311-313 varies depending on a specific pattern. In FIG. 14, the distance between the pillars of a first column and the closest adjacent doping region 312 is defined as a third distance D3. In FIG. 15, the distance between the pillars of a second column and the closest adjacent doping region 311-313 is defined as a fourth distance D4. Similar to the pillars 113 of the first column, the distance between the pillars of a third column and the closest adjacent doping region 313 is defined to a third distance D3. The third distance D3 is shorter than the fourth distance D4.

The distances between the cell strings and the closest doping regions 311-313 may be the third distance D3 or the fourth distance D4. Thus, the bit lines BL1-BL3 may be divided into two groups depending on the respective distances on the substrate 111 between the cell strings CS and the closest doping regions 311-313. For example, the bit lines BL1-BL3 may be divided into a first group in which the distance between each of the cell strings and the closest doping region 311-313 is the third distance D3, and a second group in which the distance between each of the cell strings and the closest doping region 311-313 is the fourth distance D4. The first group includes the bit lines BL1 and BL3 and the second group includes the bit line BL2.

The bit lines BL1 and BL3 of the third group are defined as near bit lines and the bit line BL2 of the fourth group is defined as a far bit line. When a read operation is performed, a level of precharge voltage being provided to the first and third bit lines BL1 and BL3 is lower than a level of precharge voltage being provided to the second bit line BL2. As described with reference to FIG. 12, a first bit line voltage VBL1 may be provided to the near bit lines BL1 and BL3 and a second bit line voltage VBL2 may be provided to the far bit line BL2.

Figure 16:
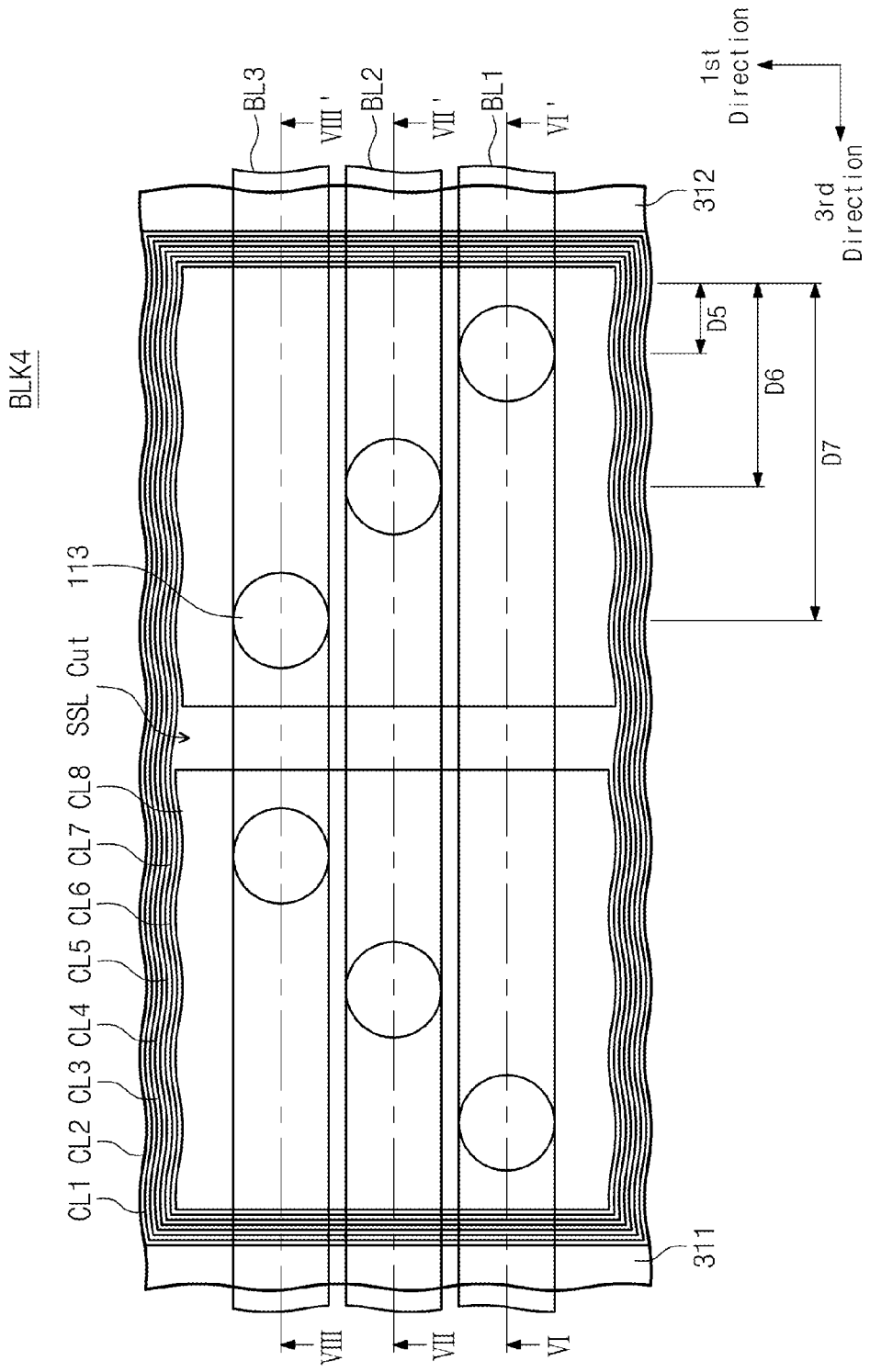
FIG. 16 is a top plan view illustrating a part of memory block, according to a third embodiment of the inventive concept.
Figure 17:
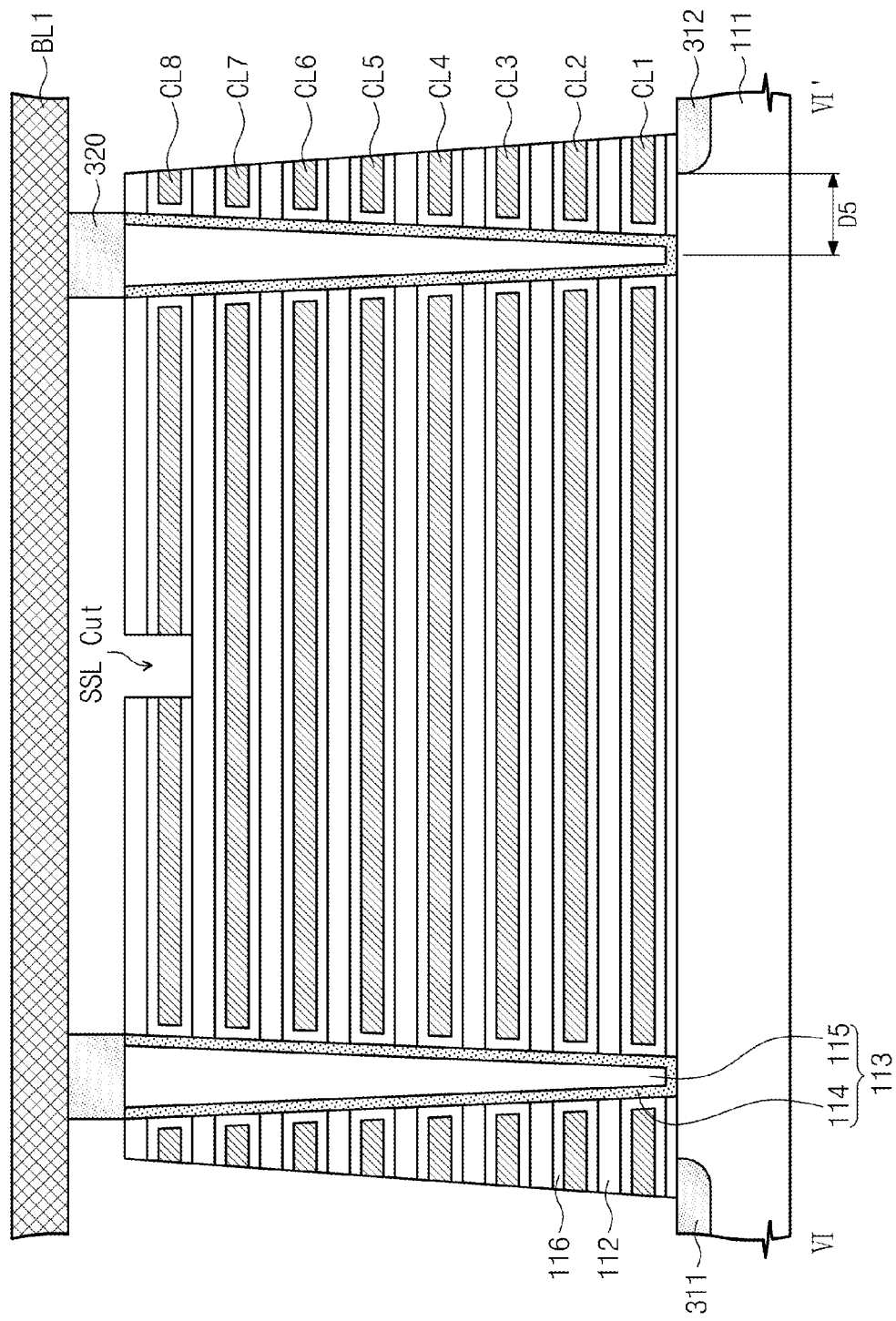
FIG. 17 is a cross sectional view taken along the line VI-VI' of FIG. 16, according to a third embodiment of the inventive concept.
Figure 18:
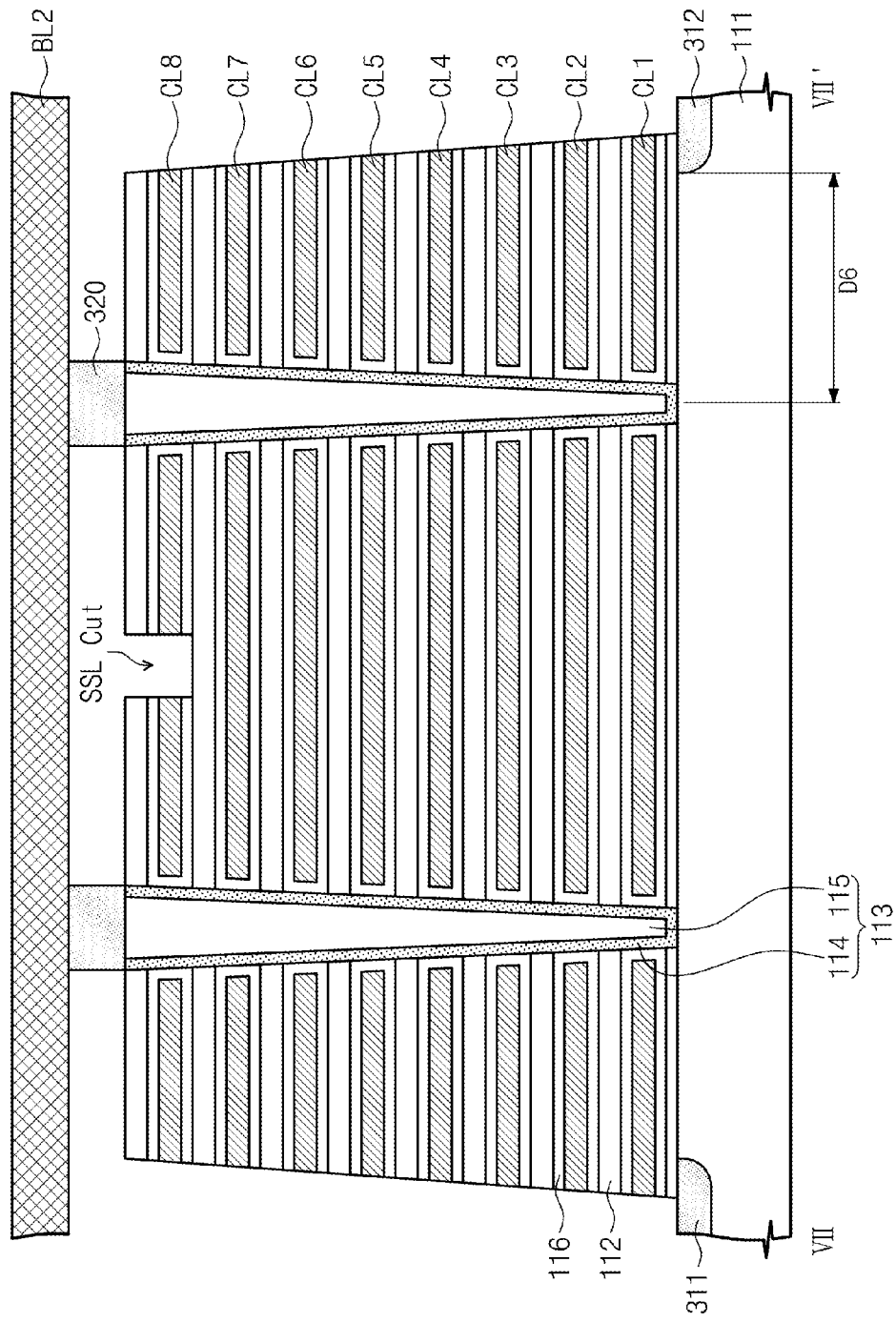
FIG. 18 is a cross sectional view taken along the line VII-VII' of FIG. 16, according to a third embodiment of the inventive concept.
Figure 19:
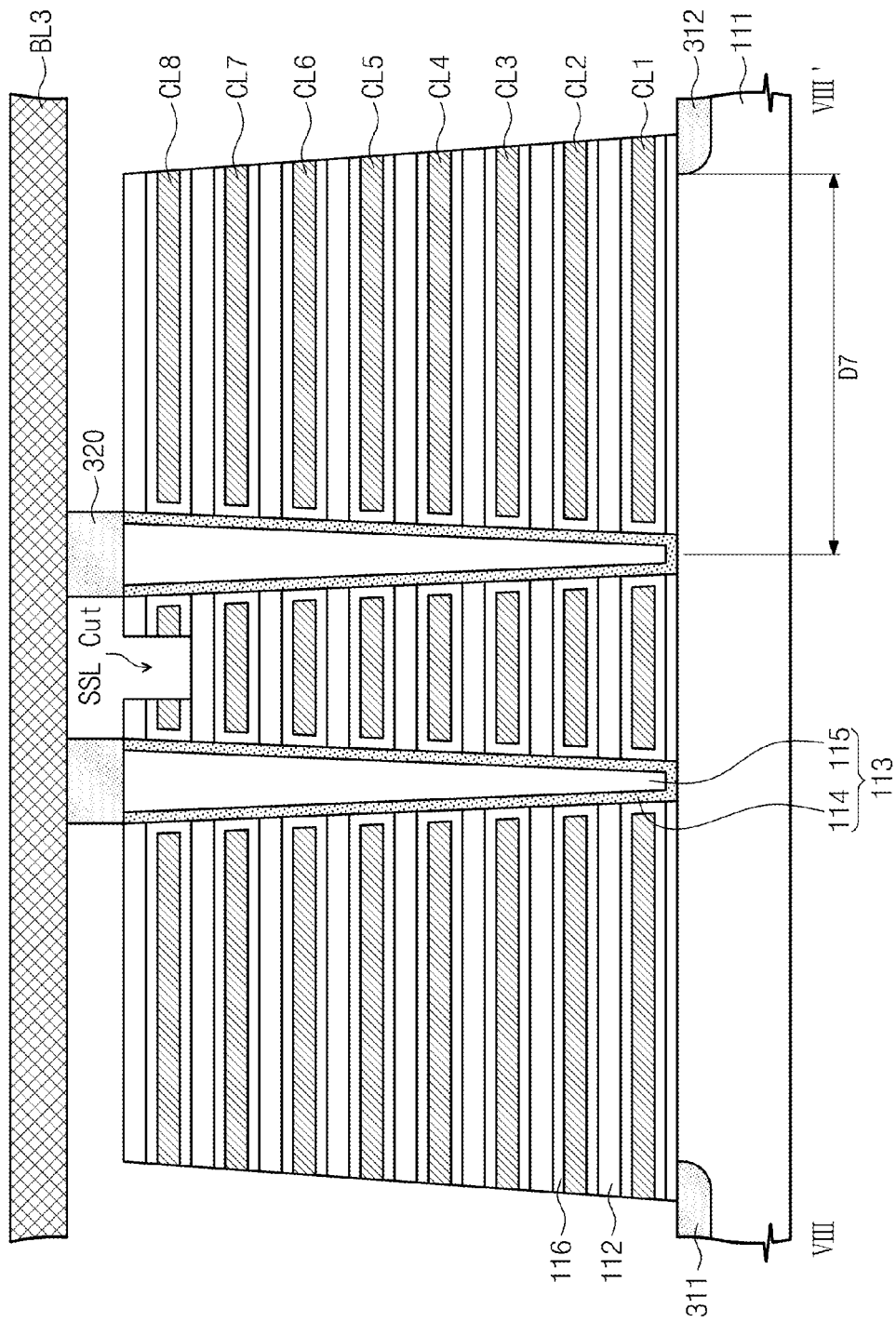
FIG. 19 is a cross sectional view taken along the line VIII-VIII' of FIG. 16, according to a third embodiment of the inventive concept.

FIG. 16 is a top plan view illustrating a part of memory block BLK4, according to a third embodiment. More particularly, FIG. 16 is a top plan view of conductive layers of the memory block BLK4. FIG. 17 is a cross sectional view taken along the line VI-VI' of FIG. 16, FIG. 18 is a cross sectional view taken along the line VII-VII' of FIG. 16, and FIG. 19 is a cross sectional view taken along the line VIII-VIII' of FIG. 16, according to the third embodiment.

As described with reference to FIGS. 3 through 6, the insulating materials 112, the pillars 113, the insulating layers 116 and the conductive materials CL1-CL8 are provided in a region on the substrate 111 between adjacent doping regions among the doping regions 311-313.

Similar to the memory block BLK2 described with reference to FIGS. 8 through 12, a string select line cut SSL cut is provided in a region between the doping regions of the memory block BLK4. Pillars 113 located to the left (i.e., a third direction) of the string select line cut SSL cut and to the right (i.e., an opposite the third direction) of the first doping region 311, are defined as pillars 113 of a first row. Pillars 113 located to the right (i.e., opposite the third direction) of the string select line cut SSL cut and to the left (i.e., the third direction) of the second doping region 312 are defined as pillars 13 of second row.

An equivalent circuit of the memory block BLK4 in accordance with the third embodiment is substantially identical to an equivalent circuit illustrated in FIG. 6, except that the cell strings CS are illustrated over a second row and a third column. Thus, the description will not be repeated.

In the memory block BLK4, the pillars 113 corresponding to one row are provided according to a specific pattern. The distance between the pillars corresponding to one row and the doping regions 311 and 312 varies depending on a specific pattern. In FIG. 17, the distance between the pillars of a second row and a first column and the closest adjacent doping region 312 is defined to a fifth distance D5. In FIG. 18, the distance between the pillars 113 of a second row and a second column and the closest adjacent doping region 312 is defined to a sixth distance D6. In FIG. 19, the distance between the pillars 113 of a second row and a third column and the closest adjacent doping region 312 is defined to a seventh distance D7. The sixth distance D6 is shorter than the seventh distance D7.

The distances between the cell strings CS and the doping regions 311 and 312 may be one of the fifth through seventh distances D5, D6 and D7. Thus, the bit lines BL1-BL3 may be divided into three groups depending on the distance on the substrate 111 between the cell strings CS and the closest doping regions 311 and 312. For example, the bit lines BL1-BL3 may be divided into a first group, in which the distance between each of the cell strings CS and the closest doping region 311-312 is the fifth distance D5 (the shortest or closest distance), a second group, in which the distance between each of the cell strings and the closest doping region 311-312 is the sixth distance D6 (intermediate or medium distance) and a third group, in which the distance between each of the cell strings and the closest doping region 311-312 is the seventh distance D7 (the longest or farthest distance). The first bit line BL1 is included in the first group, the second bit line BL2 is included in the second group and the third bit line BL3 is included in the third group.

As described with reference to FIG. 11, when a read operation is performed, a level of precharge voltage being provided to the bit lines BL1-BL3 is controlled depending on the distance on the substrate 111 between the cell strings CS and the doping regions 311 and 312.

Figure 20:
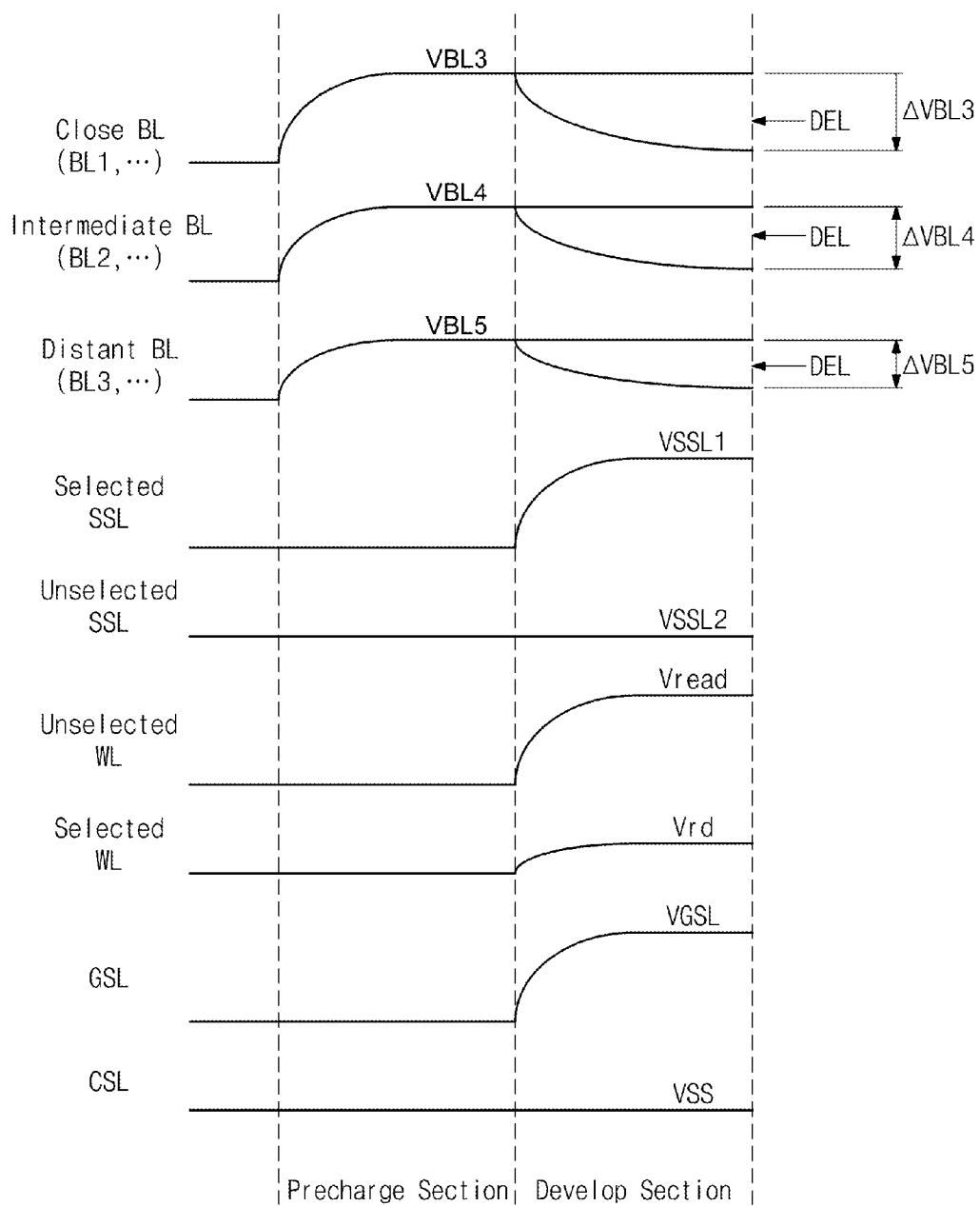
FIG. 20 is a timing diagram illustrating a voltage change further to a read operation of memory block described with reference to FIGS. 16 through 19, according to embodiments of the inventive concept.

FIG. 20 is a timing diagram illustrating voltage changes corresponding to performance of a read operation of memory block BLK4, described with reference to FIGS. 16 through 19. Referring to FIGS. 16 through 20, in a precharge section, a third bit line voltage VBL3 is provided to a close or near bit line. The near bit line indicates bit lines BL of the first group in which the distance between each of the cell strings CS and the closest doping region 311-312 is the fifth distance D5, which is the shortest distance. That is, the third bit line voltage VBL3 is provided to the first bit line BL1. In the develop operation, a voltage change in the near bit lines BL of the first group is a third voltage change ΔVBL3.

A fourth bit line voltage VBL4 is provided to an intermediate or medium bit line. The medium bit line indicates bit lines of the second group, in which the distance between each of the cell strings and the closest doping region 311-312 is the sixth distance D6, which is the intermediate distance. That is, the fourth bit line voltage VBL4 is provided to the second bit line BL2. During the develop operation, a voltage change in the medium bit lines BL of the second group is a fourth voltage change ΔVBL4.

A fifth bit line voltage VBL5 is provided to a distant or far bit line. The far bit line indicates bit lines of the third group, in which the distance between each of the cell strings and the closest doping region 311-312 is the seventh distance D7, which is the longest distance. That is, the fifth bit line voltage VBL5 is provided to the third bit line BL3. In the develop section, a voltage change in the far bit lines BL of the third group is a fifth voltage change ΔVBL5.

In a develop section, voltages of the string select lines SSL1 and SSL2, the word lines WL1-WL6, the ground select line GSL and the common source line CSL are controlled. The voltages of the string select lines SSL1 and SSL2, the word lines WL1-WL6, the ground select line GSL and the common source line CSL are controlled using the same method as that described with reference to FIG. 7. Thus, the description will not be repeated.

The third voltage change ΔVBL3 is greater than the fourth voltage change ΔVBL4, and the fourth voltage change ΔVBL4 is greater than the fifth voltage change ΔVBL5. However, since levels of precharge voltage being provided to the bit lines BL are controlled to the third through fifth line voltages VBL3-VBL5, a read margin of the selected memory cells MC is optimized.

Figure 21:
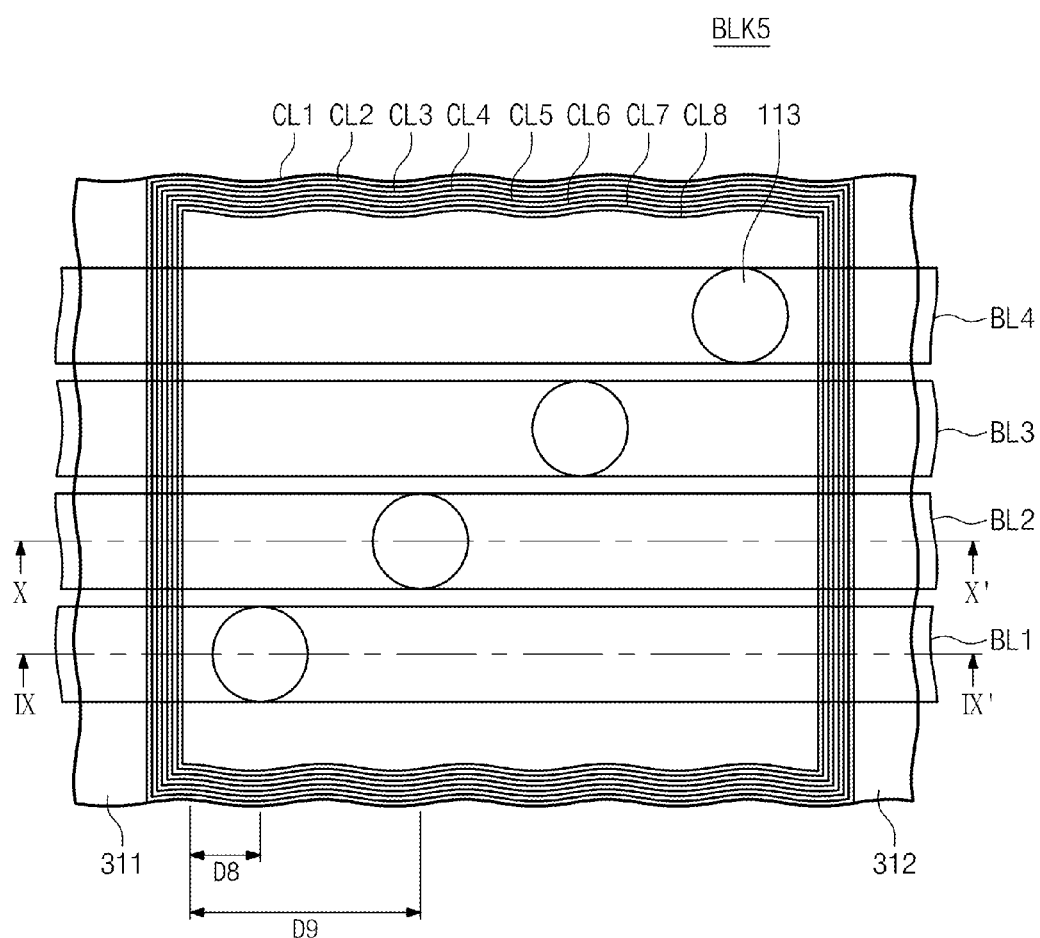
FIG. 21 is a top plan view illustrating a part of memory block, according to a fourth embodiment of the inventive concept.
Figure 22:
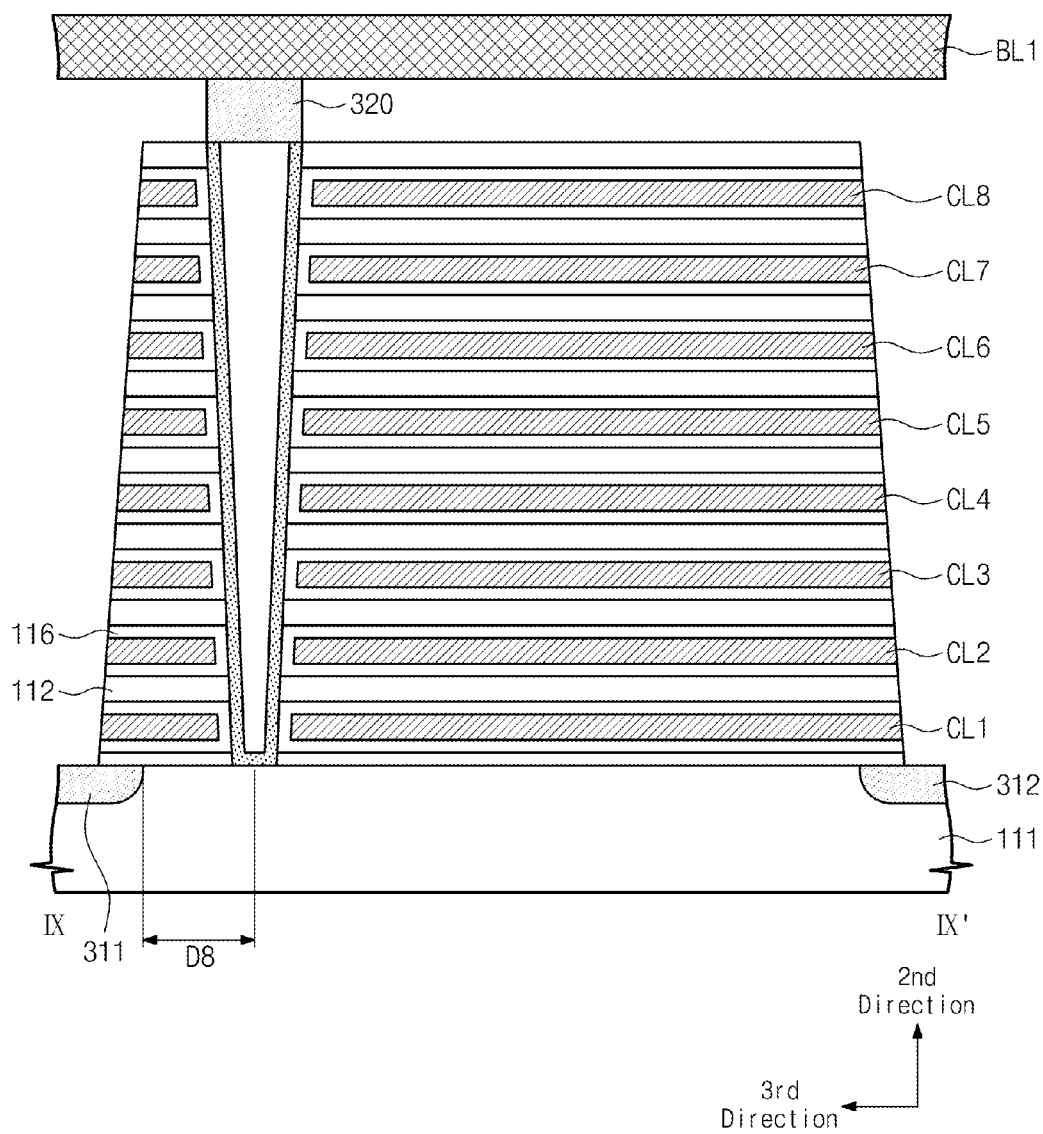
FIG. 22 is a cross sectional view taken along the line IX-IX' of FIG. 21, according to a fourth embodiment of the inventive concept.
Figure 23:
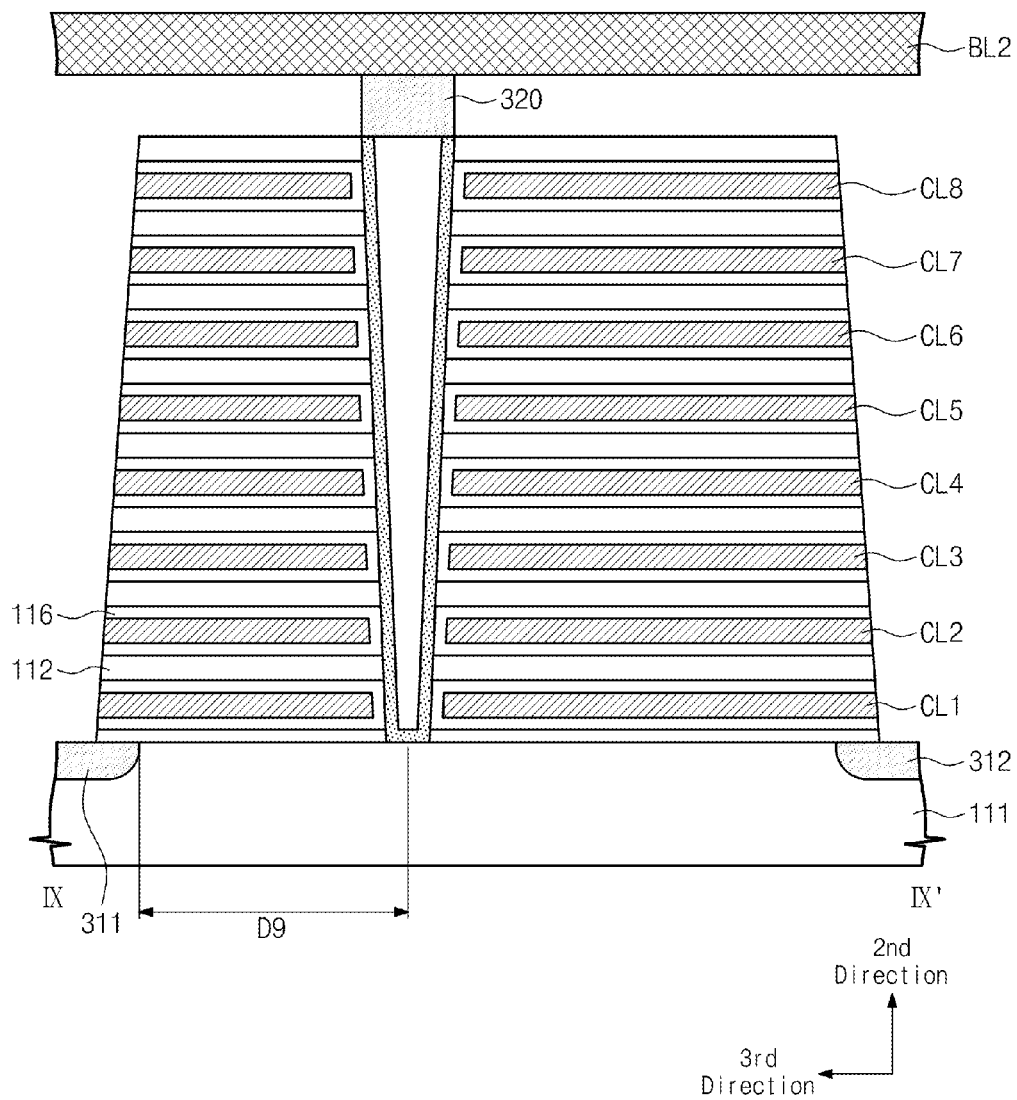
FIG. 23 is a cross sectional view taken along the line X-X' of FIG. 21, according to a fourth embodiment of the inventive concept.

FIG. 21 is a top plan view illustrating a part of memory block BLK5, according to a fourth embodiment of the inventive concept. More particularly, FIG. 21 is a top plan view of conductive layers of the memory block BLK5. FIG. 22 is a cross sectional view taken along the line IX-IX' of FIG. 21, and FIG. 23 is a cross sectional view taken along the line X-X' of FIG. 21, according to the fourth embodiment. For purposes of brevity, reference numerals of the pillar 113, the channel layer 114 and the internal material 115 are omitted in FIGS. 22 and 23, although these features are included in the fourth embodiment.

As described with reference to FIGS. 3 through 6, the insulating material 112, the pillars 112, the insulating layers 116 and the conductive materials CL1-CL8 are provided on the substrate 111 between the adjacent doping regions 311 and 312.

The pillars 113 are defined to correspond to a first row. An equivalent circuit of the memory block BLK5 in accordance with the fourth embodiment is substantially identical to the equivalent circuit illustrated in FIG. 6, except that the cell strings CS are illustrated over a first row and a fourth column. Thus, the description will not be repeated.

In the memory block BLK5, the pillars 113 corresponding to one row are provided according to a specific pattern. The distance between the pillars corresponding to one row and the doping regions 311 and 312 varies depending on a specific pattern. For instance, in FIG. 22, the distance between the pillar 113 of a first row and a first column and the closest adjacent doping region 311 is defined to be an eighth distance D8. In FIG. 23, the distance between the pillar 113 of a first row and a second column and the closest adjacent doping region 311 is defined to be a ninth distance D9.

Similar to the pillar 113 of a first row and a second column, the distance between the pillar 113 of a first row and a third column and the closest adjacent doping region 311 is defined to be a ninth distance D9. Similar to the pillar 113 of a first row and a first column, the distance between the pillar 113 of a first row and a fourth column and the closest adjacent doping region 311 is defined to be an eighth distance D8.

The distance between the cell strings CS and the doping regions 311 and 312 may be the eighth distance D8 or the ninth distance D9. Thus, the bit lines BL1-BL4 may be divided into two groups depending on the respective distances on the substrate 111 between the cell strings CS and the doping regions 311 and 312. For instance, the bit lines BL1-BL4 may be divided into a first group in which the distance between each of the cell strings CS and the closest doping region 311-312 is the eighth distance D8, and a second group in which the distance between each of the cell strings CS and the closest doping region 311-312 is the ninth distance D9. The eighth distance D8 is shorter than the ninth distance D9. The first group includes the bit lines BL1 and BL4 and the second group includes the bit line BL2 and BL3.

As described with reference to FIG. 11, when a read operation is performed, a level of precharge voltage being provided to the bit lines BL1-BL4 is controlled depending on the distance on the substrate 111 between the cell strings CS and the doping regions 311 and 312. Also, as described with reference to FIG. 12, a first bit line voltage VBL1 may be provided to bit lines corresponding to the first group and a second bit line voltage VBL2 may be provided to bit lines corresponding to the second group.

Figure 24:
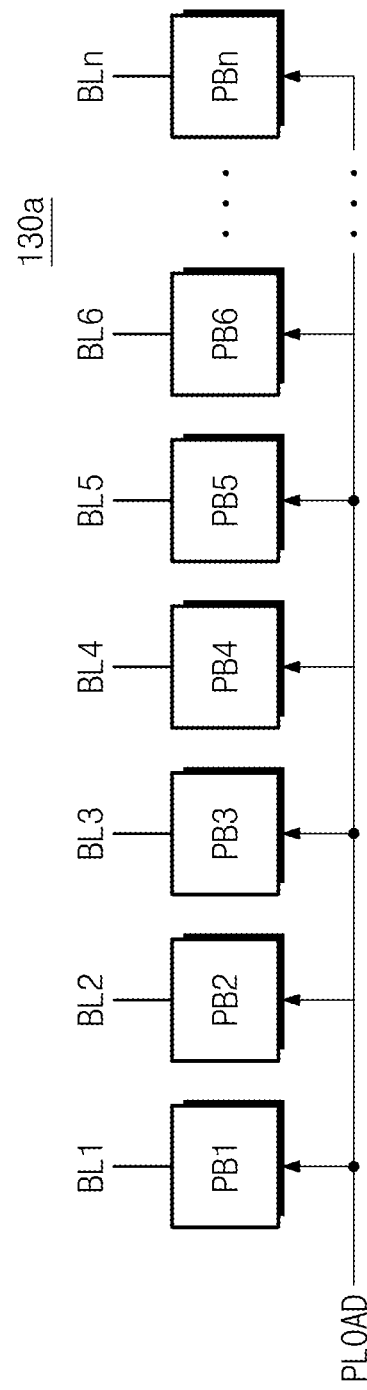
FIG. 24 is a block diagram illustrating a first embodiment of a read and write circuit, according to the inventive concept.

FIG. 24 is a block diagram illustrating a first embodiment of a read and write circuit 130a in accordance with the inventive concept. Referring to FIG. 24, the read and write circuit 130a includes multiple page buffers PB1-PBn. Each of the page buffers PB1-PBn is connected to one of multiple bit lines BL1-BLn. Each of the page buffers PB1-PBn receives a load signal PLOAD provided from the control logic 150 of FIG. 1.

Figure 25:
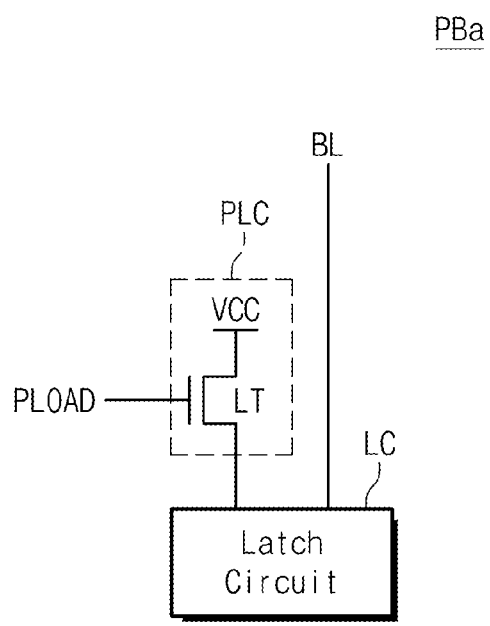
FIG. 25 is a block diagram illustrating a first embodiment of page buffer, according to the inventive concept.

FIG. 25 is a block diagram illustrating a first embodiment of a page buffer PBa. Referring to FIG. 25, the page buffer PBa includes a precharge load circuit PLC and a latch circuit LC. The latch circuit LC is connected to a bit line BL. The latch circuit LC is configured to set up the bit line BL according to the stored data and to store data according to a voltage or a current of the bit line BL.

The precharge load circuit PLC includes a load transistor LT. The load transistor LT is configured to electrically connect a node of power supply voltage VCC to the latch circuit LC in response to the load signal PLOAD. The latch circuit LC connects the precharge load circuit PLC and the bit line BL to each other.

Referring to FIGS. 1, 24 and 25, the control logic 150 is configured to activate the load signal PLOAD in a precharge section of a read operation. At this time, the node of the power supply voltage VCC is electrically connected to the bit line BL through the load transistor LT and the latch circuit LC. That is, the bit line BL is precharged by a voltage being provided from the node of the power supply voltage VCC of the precharge load circuit PLC.

In the read and write circuit 130a, according to a first embodiment, threshold voltages of the load transistors LT of the page buffers PB1-PBn are set up differently.

As described with reference to FIGS. 8 through 12, 13 through 15 and 21 through 23, it is assumed that the bit lines BL are divided into two groups, including a first group in which the distance on the substrate 111 between cell strings CS and the closest adjacent doping region is short, and a second group in which the distance on the substrate 111 between cell strings CS and the closest adjacent doping region is long. A threshold voltage of the load transistor LT of the page buffer PB connected to bit lines of the first group is set to a first threshold voltage, and a threshold voltage of the load transistor LT of the page buffer PB connected to bit lines of the second group is set to a second threshold voltage. The second threshold voltage is set to be lower than the first threshold voltage.

As the threshold voltage of the load transistor LT is set lower, the level of voltage transferred to the bit line BL from the node of power supply voltage VCC through the load transistor LT and the latch circuit LC increases. Thus, in the precharge section, the level of precharge voltage being provided to the bit lines BL of the second group becomes higher than the level of precharge voltage being provided to the bit lines BL of the first group.

As described with reference to FIGS. 16 through 19, it is assumed that the bit lines BL are divided into three groups, including a first group in which the distance on the substrate 111 between cell strings CS and the closest adjacent doping region is shortest, a second group in which the distance on the substrate 111 between cell strings CS and the closest adjacent doping region is medium, and a third group in which the distance on the substrate 111 between cell strings CS and the closest adjacent doping region is longest. A threshold voltage of the load transistor LT of the page buffer PB connected to bit lines of the first group is set to a first threshold voltage. A threshold voltage of the load transistor LT of the page buffer PB connected to bit lines of the second group is set to a second threshold voltage. A threshold voltage of the load transistor LT of the page buffer PB connected to bit lines of the third group is set to a third threshold voltage. The second threshold voltage is set to be lower than the first threshold voltage, and third threshold voltage is set to be lower than the second threshold voltage.

As the distance on the substrate 111 between the cell string CS and the closest adjacent doping region increases, a corresponding threshold voltage of the load transistor LT of the page buffer PB may be set lower. Also, as the distance on the substrate 111 between the cell string CS and the closest adjacent doping region decreases, a corresponding threshold voltage of the load transistor LT of the page buffer PB may be set higher.

Thus, as the distance on the substrate 111 between the cell string CS and the closest adjacent doping region increases, a level of precharge voltage being provided to a corresponding page buffer PB increases. Also, as the distance on the substrate 111 between the cell string CS and the closest adjacent doping region decreases, a level of precharge voltage being provided to a corresponding page buffer PB decreases.

Figure 26:
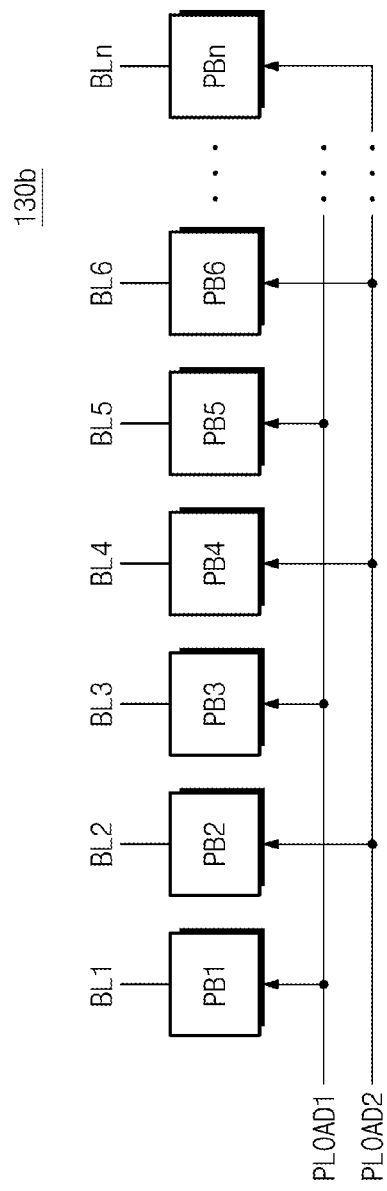
FIG. 26 is a block diagram illustrating a second embodiment of a read and write circuit, according to the inventive concept.

FIG. 26 is a block diagram illustrating a second embodiment of a read and write circuit 130b. Referring to FIG. 26, the read and write circuit 130b includes multiple page buffers PB1-PBn, where the page buffers PB1-PBn are divided into m groups, where m is an integer greater than or equal to 1 (m=2 in the depicted configuration). Each of the page buffers PB1-PBn is connected to one of multiple bit lines BL1-BLn. Each of the page buffers PB1-PBn may be configured the same as the page buffer PBa described with reference to FIG. 25, and load transistors LT of the page buffers PB1-PBn have the same threshold voltage.

Referring to FIGS. 25 and 26, a first load signal PLOAD1 and a second load signal PLOAD2 are provided to the page buffers PB1-PBn. The first load signal PLOAD1 is provided to bit lines of the first group, in which the distance on the substrate 111 between the cell strings CS and the closest adjacent doping region is short. A second load signal PLOAD2 is provided to bit lines of the second group, in which the distance on the substrate 111 between the cell strings CS and the closest adjacent doping region is long. For example, the first load signal PLOAD1 is provided to odd bit lines BL and the second load signal PLOAD2 is provided to even bit lines BL. A level of the second load signal PLOAD2 is set to be higher than a level of the first load signal PLOAD1.

As the level of the load signal PLOAD being provided to the load transistor LT increases, the level of voltage provided to the bit line BL from a node of power supply voltage VCC through the load transistor LT and the latch circuit LC also increases. Thus, when the level of the second load signal PLOAD2 is higher than the level of the first load signal PLOAD1, the level of precharge voltage being provided to the bit lines of the second group becomes higher than the level of precharge voltage being provided to the bit lines of the first group.

Figure 27:
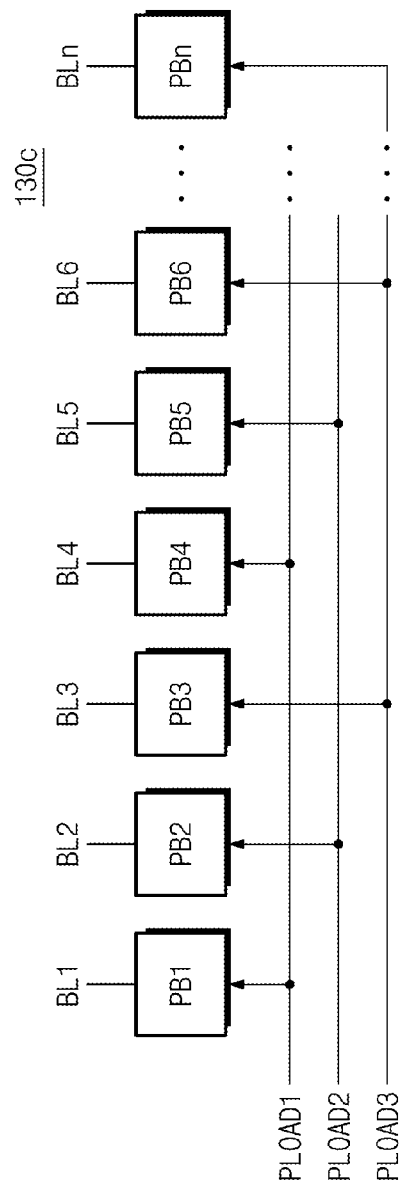
FIG. 27 is a block diagram illustrating a third embodiment of a read and write circuit, according to the inventive concept.

FIG. 27 is a block diagram illustrating a third embodiment of a read and write circuit 130c. Referring to FIG. 26, the read and write circuit 130c includes multiple page buffers PB1-PBn, where the page buffers PB1-PBn are divided into m group, where m is an integer greater than or equal to 1 (m=3 in the depicted configuration). The page buffers PB1-PBn are connected to multiple bit lines BL1-BLn, respectively. Each of the page buffers PB1-PBn may be configured the same as the page buffer PBa described with reference to FIG. 25, and load transistors LT of the page buffers PB1-PBn have the same threshold voltage.

Referring to FIGS. 25 and 27, a first load signal PLOAD1, a second load signal PLOAD2 and a third load signal PLOAD3 are provided to the page buffers PB1-PBn. The first load signal PLOAD1 is provided to bit lines of the first group, in which the distance on the substrate 111 between the cell strings CS and the closest adjacent doping region is the shortest distance. A second load signal PLOAD2 is provided to bit lines of the second group, in which the distance on the substrate 111 between the cell strings CS and the closest adjacent doping region is a medium distance. The third load signal PLOAD3 is provided to bit lines of the third group, in which the distance on the substrate 111 between the cell strings CS and the closest adjacent doping region is the longest distance.

The first load signal PLOAD1 is provided to $(3k-2)^{th}$ bit lines BL, such as the first bit line BL1 and the fourth bit line BL4, where k is an integer greater than or equal to 1. The second load signal PLOAD2 is provided to $(3k-1)^{th}$ bit lines BL, such as the second bit line BL2 and the fifth bit line BL5. The third load signal PLOAD3 is provided to $(3k)^{th}$ bit lines BL, such as the third bit line BL3 and the sixth bit line BL6. The level of the second load signal PLOAD2 is set to be higher than the level of the first load signal PLOAD1, and the level of the third load signal PLOAD3 is set to be higher than the level of the second load signal PLOAD2.

Figure 28:
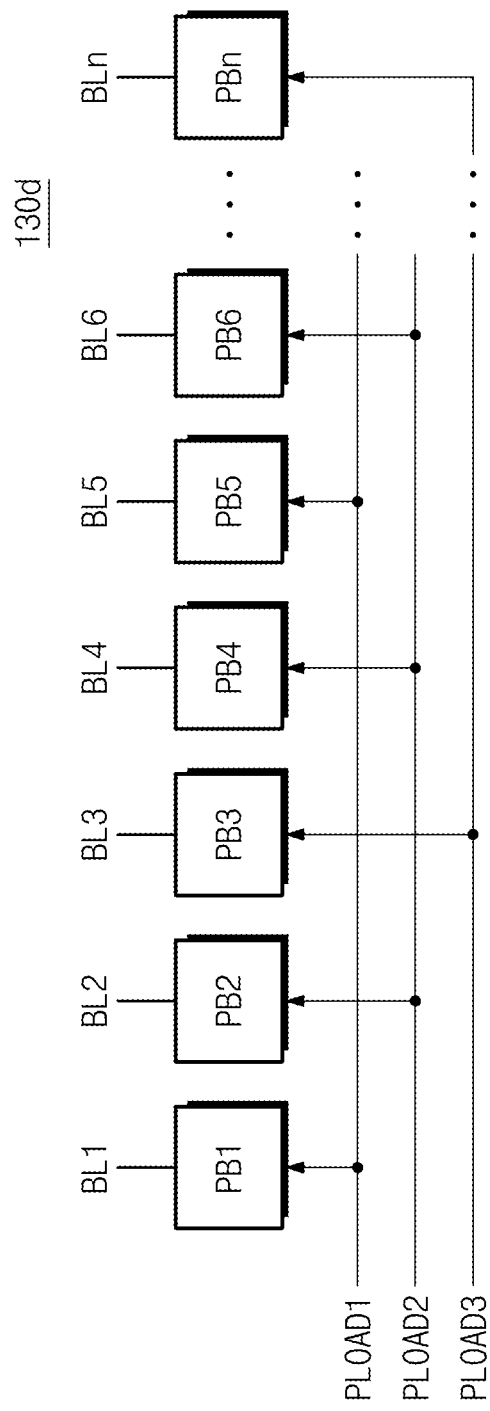
FIG. 28 is a block diagram illustrating a fourth embodiment of a read and write circuit, according to the inventive concept.

FIG. 28 is a block diagram illustrating a fourth embodiment of a read and write circuit 130d. Referring to FIG. 28, the read and write circuit 130d includes multiple page buffers PB1-PBn. The page buffers PB1-PBn are connected to multiple bit lines BL1-BLn, respectively. Each of the page buffers PB1-PBn may be configured the same as the page buffer PBa described with reference to FIG. 25, and load transistors LT of the page buffers PB1-PBn have the same threshold voltage.

Referring to FIGS. 25 and 28, a first load signal PLOAD1, a second load signal PLOAD2 and a third load signal PLOAD3 are provided to the page buffers PB1-PBn. The first load signal PLOAD1 is provided to bit lines of the first group, in which the distance on the substrate 111 between the cell strings CS and the closest adjacent doping region is the shortest distance. The second load signal PLOAD2 is provided to bit lines of the second group, in which the distance on the substrate 111 between the cell strings CS and the closest adjacent doping region is the medium distance. The third load signal PLOAD3 is provided to bit lines of the third group, in which the distance on the substrate 111 between the cell strings CS and the closest adjacent doping region is the longest distance.

The first load signal PLOAD1 is provided to $(4k-3)^{th}$ bit lines BL, such as the first bit line BL1 and the fifth bit line BL5, where k is an integer greater than or equal to 1. The second load signal PLOAD2 is provided to $(2k)^{th}$ bit lines BL, such as the second bit line BL2, the fourth bit line BL4 and the sixth bit line BL6. The third load signal PLOAD3 is provided to $(4k-1)^{th}$ bit lines BL, such as the third bit line BL3 and the seventh bit line BL7 (not illustrated). The level of the second load signal PLOAD2 is set to be higher than the level of the first load signal PLOAD1, and the level of the third load signal PLOAD3 is set to be higher than the level of the second load signal PLOAD2.

Figure 29:
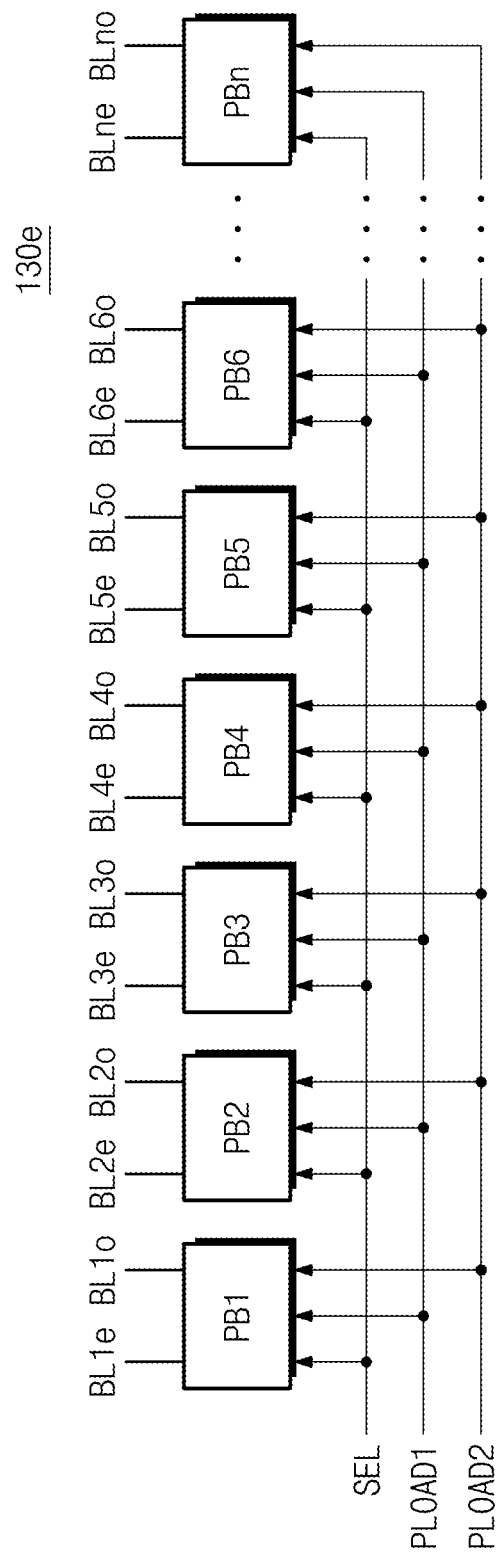
FIG. 29 is a block diagram illustrating a fifth embodiment of a read and write circuit, according to the inventive concept.

FIG. 29 is a block diagram illustrating a fifth embodiment of a read and write circuit 130e. Referring to FIG. 29, the read and write circuit 130e includes multiple page buffers PB1-PBn. The page buffers PB1-PBn are connected to even bit lines BL1e-BLne and odd bit lines BL1o-BLno, respectively. One page buffer PB is connected to one even bit line BLe and one odd bit line BLo. Select signal SEL and the first and second load signals PLOAD1 and PLOAD2 are provided to each of the page buffers PB1-PBn.

Figure 30:
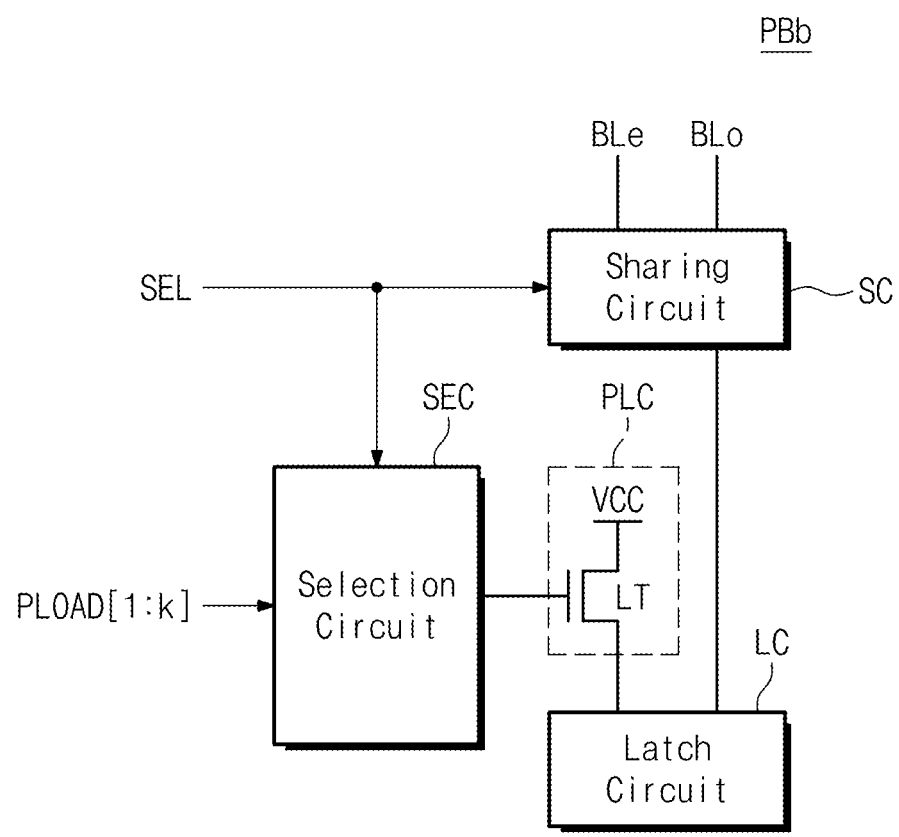
FIG. 30 is a block diagram illustrating a second embodiment of page buffer, according to the inventive concept.

FIG. 30 is a block diagram illustrating a second embodiment of a page buffer. Referring to FIG. 30, the page buffer PBb includes a precharge load circuit PLC, a latch circuit LC, a sharing circuit SC and a select circuit SEC.

The latch circuit LC is connected to a bit line BL. The latch circuit LC is configured to set up the bit line BL according to the stored data, and to store data according to a voltage or a current.

The precharge load circuit PLC includes a load transistor LT. The load transistor LT is configured to electrically connect a node of power supply voltage VCC to the latch circuit LC in response to an output signal of the select circuit SEC. The latch circuit LC connects the precharge load circuit PLC and the sharing circuit SC to each other.

The sharing circuit SC operates in response to the select signal SEL. In response to the select signal SEL, the sharing circuit BLe connects the latch circuit LC to an even bit line BLe or an odd bit line BLo. That is, in response to the select signal SEL, the node of power supply voltage VCC is connected to an even bit line BLe or an odd bit line BLO through the load transistor LT, the latch circuit LC and the sharing circuit SC.

The select circuit SEC receives multiple load signals PLOAD[1:k]. In response to the select signal SEC, the select circuit SEC selects one of the received load signals PLOAD [1:k], and provides the selected load signal PLOAD to the load transistor LT. Referring to FIGS. 1, 29 and 30, the control logic 150 of FIG. 1 provides first and second load signals PLOAD1 and PLOAD2 and a select signal SEL to the page buffers PB1-PBn.

As described with reference to FIGS. 8 through 12, the odd bit lines BLo are bit lines of the first group and the even bit lines BLe are bit lines of the second group. The first load signal PLOAD1 corresponds to the bit lines BL of the first group, and the second load signal PLOAD2 corresponds to the bit lines BL of the second group. The level of the first load signal PLOAD is lower than the level of the second load signal PLOAD2.

When the sharing circuit SC of each of the page buffers PB1-PBn selects an odd bit line BLo in response to the select signal SEL, the select circuit SEC transfers the first load signal PLOAD1 to the load transistor LT in response to the select signal SEL. When the sharing circuit SC of each of the page buffers PB1-PBn selects an even bit line BLe in response to the select signal SEL, the select circuit SEC transfers the second load signal PLOAD2 to the load transistor LT in response to the select signal SEL. That is, when the bit lines BL of the first group are connected to the page buffers PB1-PBn, a precharge voltage corresponding to the first load signal PLOAD1 is provided to the bit lines BL. When the bit lines BL of the second group are connected to the page buffers PB1-PBn, a precharge voltage corresponding to the second load signal PLOAD2 is provided to the bit lines BL.

Figure 31:
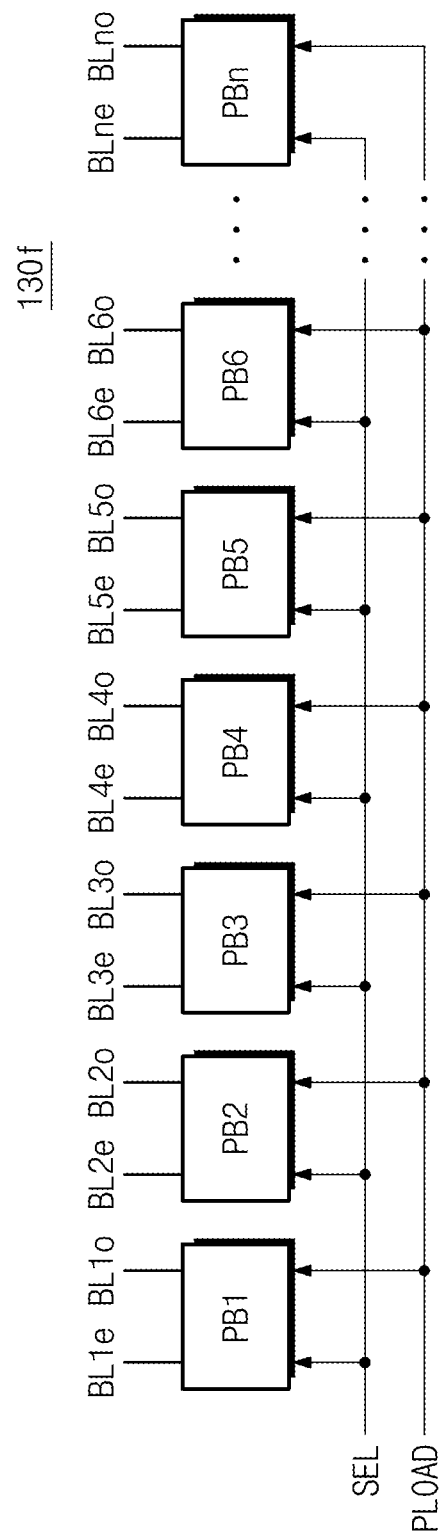
FIG. 31 a block diagram illustrating a sixth embodiment of a read and write circuit, according to the inventive concept.

FIG. 31 is a block diagram illustrating a sixth embodiment of a read and write circuit 131f. Referring to FIG. 31, the read and write circuit 130f includes multiple page buffers PB1-PBn. The page buffers PB1-PBn are connected to even bit lines BL1e-BLne and odd bit lines BL1o-BLno, where one page buffer PB is connected to one even bit line BLe and one odd bit line BLo. A select signal SEL and a load signal PLOAD are provided to the page buffers PB1-PBn.

Figure 32:
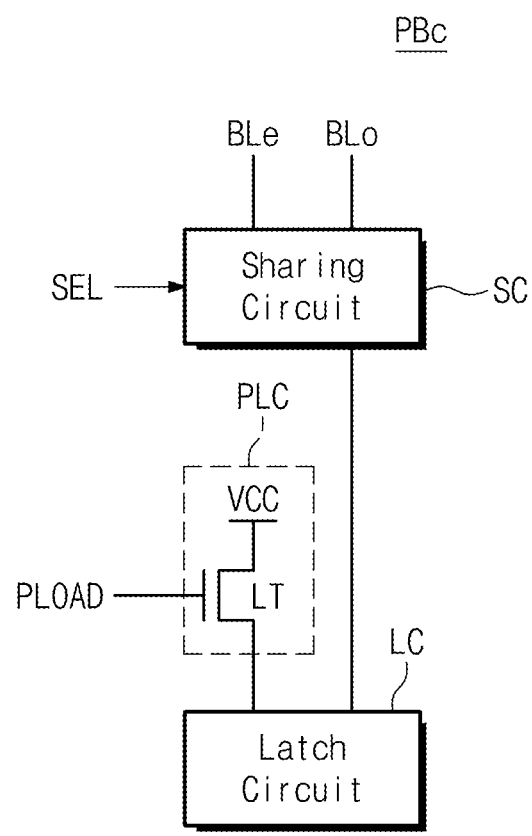
FIG. 32 is a block diagram illustrating a third embodiment of page buffer, according to the inventive concept.

FIG. 32 is a block diagram illustrating a third embodiment of a page buffer. Referring to FIG. 32, the page buffer PBc includes a precharge load circuit PLC, a latch circuit LC and a sharing circuit SC.

The latch circuit is connected to a bit line BL. The latch circuit LC is configured to set up the bit line BL according to the stored data, and to store data according to a voltage or a current.

The precharge load circuit PLC includes a load transistor LT. The load transistor LT is configured to electrically connect a node of power supply voltage VCC to the latch circuit LC in response to a load signal PLOAD. The latch circuit LC connects the precharge load circuit PLC and the sharing circuit SC to each other.

The sharing circuit SC operates in response to the select signal SEL. In response to the select signal SEL, the sharing circuit BLe connects the latch circuit LC to an even bit line BLe or an odd bit line BLo. That is, in response to the select signal SEL, the node of power supply voltage VCC is connected to the even bit line BLe or the odd bit line BLO through the load transistor LT, the latch circuit LC and the sharing circuit SC. As described with reference to FIGS. 8 through 12, the odd bit lines BLo are bit lines BL of the first group and the even bit line BLe are bit lines of the second group.

The control logic 150 of FIG. 1 may control a level of the load signal PLOAD differently. When the select signal SEL is generated so that the bit lines BL of the first group are selected by the page buffers PB1-PBn, the control logic 150 may control the level of the load signal PLOAD to a first level. When the select signal SEL is generated so that the bit lines BL of the second group are selected by the page buffers PB1-PBn, the control logic 150 may control the level of the load signal PLOAD to a second level. The first and second levels are levels that can turn on the load transistor LT, where the first level is higher than the second level.

That is, when the bit lines BL of the first group are connected to the page buffers PB1-PBn, a precharge voltage corresponding to the load signal PLOAD of the first level is provided to the bit lines BL. When the bit lines BL of the second group are connected to the page buffers PB1-PBn, a precharge voltage corresponding to the load signal PLOAD of the second level is provided to the bit lines BL.

Figure 33:
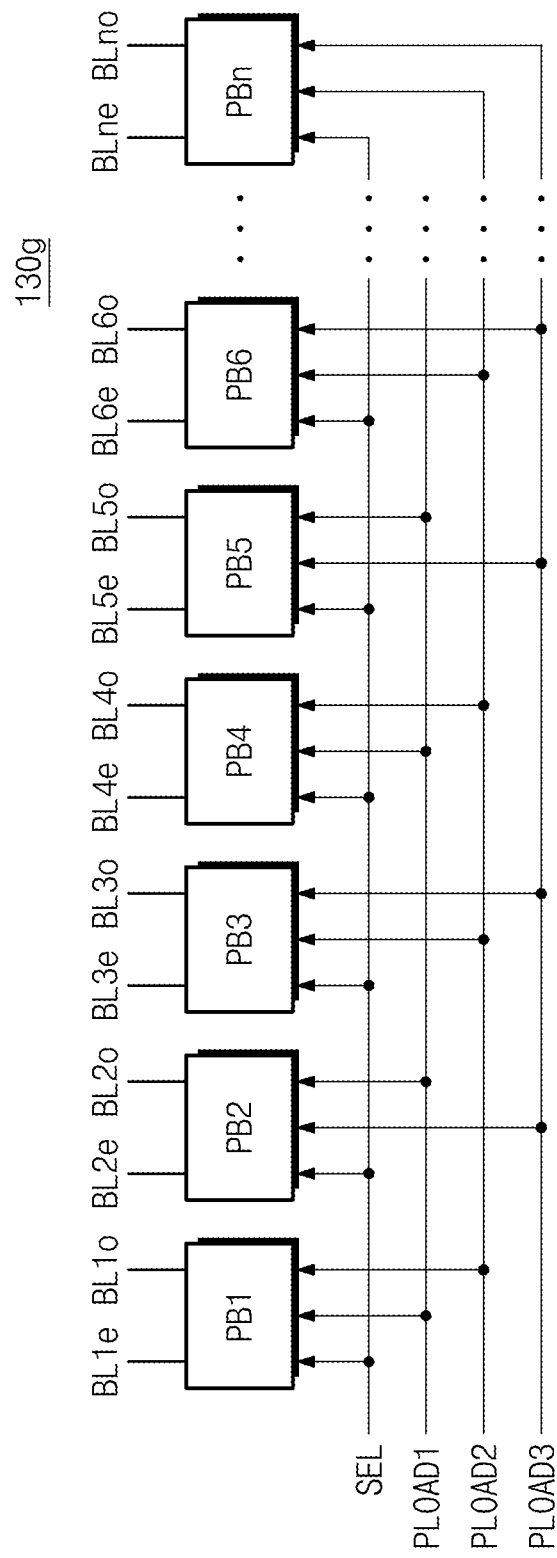
FIG. 33 is a block diagram illustrating a seventh embodiment of a read and write circuit, according to the inventive concept.

FIG. 33 is a block diagram illustrating a seventh embodiment of a read and write circuit 130g. Referring to FIG. 33, the read and write circuit 130g includes multiple page buffers PB1-PBn. The page buffers PB1-PBn are connected to even bit lines BL1e-BLne and odd bit lines BL1o-BLno. One page buffer PB is connected to one even bit line BLe and one odd bit line BLo. A select signal SEL and first through third load signals PLOAD1-PLOAD3 are provided to the page buffers PB1-PBn. Each of the page buffers PB1-PBn has the same structure as the page buffer PBb described with reference to FIG. 30.

As described with reference to FIGS. 16 through 20, the bit lines BL1e-BLne and BL1o-BLno are divided into first through third groups. Bit lines BL of the first group are the closest bit line BL, bit lines BL of the second group are the medium bit lines BL and bit lines BL of the third group are the farthest bit lines BL. It is assumed that the bit lines are counted in the order from the bit line BL on the left to the bit line BL on the right. That is, it is assumed that a first even bit line BL1e is the first bit line and a first odd bit line BL1o is the second bit line. At this time, $(3k-2)^{th}$ bit lines are included in the bit lines BL of the first group, $(3k-1)^{th}$ bit lines are included in the bit lines BL of the second group and $(3k)^{th}$ bit lines are included in the bit lines BL of the third group, where k is an integer greater than or equal to 1.

The first load signal PLOAD1 has a level corresponding to the bit lines BL of the first group. The second load signal PLOAD2 has a level corresponding to the bit lines BL of the second group. The third load signal PLOAD3 has a level corresponding to the bit lines BL of the third group. The level of the second load signal PLOAD2 is lower than the level of the first load signal PLOAD1, and the level of the third load signal PLOAD3 is lower than the level of the second load signal PLOAD2.

The first load signal PLOAD1 is provided to the page buffers PB1, PB2, PB4 and PB5 connected to $(3k-2)^{th}$ bit lines BL1e, BL2o, BL4e and BL5o. The second load signal PLOAD2 is provided to the page buffers PB1, PB3, PB4 and PB6 connected to $(3k-1)^{th}$ bit lines BL1o, BL3e, BL4o and BL6e. The third load signal PLOAD3 is provided to the page buffers PB2, PB3, PB5 and PB6 connected to $(3k)^{th}$ bit lines BL2e, BL3o, BL5e and BL6o.

Each of the page buffers PB1-PBn selects one of the even bit line BLe and the odd bit line BLo in response to the select signal SEL, and selects one of the two load signals PLOAD being received. For example, the first page buffer PB1 is connected to the even bit line BL1e of the first group and the odd bit line BL1o of the second group. When the even bit line BL1e is selected, the first load signal PLOAD1 is provided to the load transistor LT. When the odd bit line BL1o is selected, the second load signal PLOAD2 is provided to the load transistor LT.

Figure 34:
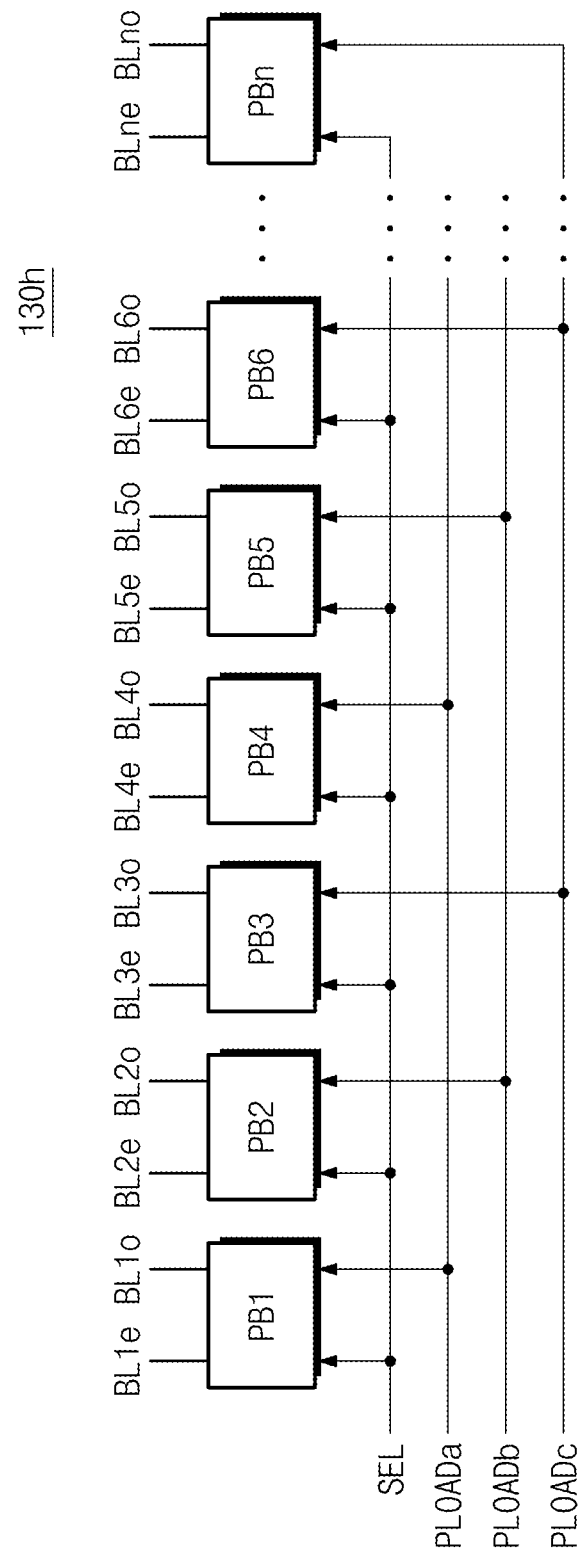
FIG. 34 is a block diagram illustrating an eighth embodiment of a read and write circuit, according to the inventive concept.

FIG. 34 is a block diagram illustrating an eighth embodiment of a read and write circuit 130h. Referring to FIG. 34, the read and write circuit 130h includes multiple page buffers PB1-PBn. The page buffers PB1-PBn are connected to even bit lines BL1e-BLne and odd bit lines BL1o-BLno. One page buffer PB is connected to one even bit line BLe and one odd bit line BLo.

A select signal SEL and first through third load signals PLOADa-PLOADc are provided to the page buffers PB1-PBn. Each of the page buffers PB1-PBn has the same structure as the page buffer PBc described with reference to FIG. 32.

As described with reference to FIGS. 16 through 20, the bit lines BL1e-BLne and BL1o-BLno are divided into first through third groups. Bit lines BL of the first group are the closest bit lines BL, bit lines B1 of the second group are the medium bit lines BL and bit lines BL of the third group are the farthest bit lines BL. It is assumed that bit lines are counted in the order from the bit line BL on the left to the bit line BL on the right. That is, it is assumed that a first even bit line BL1e is the first bit line and a first odd bit line BL1o is the second bit line. At this time, $(3k-2)^{th}$ bit lines are included in the bit lines BL of the first group, $(3k-1)^{th}$ bit lines are included in the bit lines BL of the second group and $(3k)^{th}$ bit lines are included in the bit lines BL of the third group, where k is an integer greater than or equal to 1.

The a load signal PLOADa is controlled to a first level or a second level according to the select signal SEL. The b load signal PLOADb is controlled to a third level or the first level according to the select signal SEL. The c load signal PLOADc is controlled to the second level or the third level according to the select signal SEL. The first level of the load signal PLOAD corresponds to the bit lines BL of the first group, the second level of the load signal PLOAD corresponds to the bit lines BL of the second group, and the third level of the load signal PLOAD corresponds to the bit lines BL of the third group. The second level is lower than the first level, and the third level is lower than the second level.

Referring to FIG. 33, the first and second load signals PLOAD1 and PLOAD2 are provided to the $(3k-2)^{th}$ page buffer PB, where k is an integer greater than or equal to 1. The third and first load signals PLOAD3 and PLOAD1 are provided to the $(3k-1)^{th}$ page buffer PB. The second and third load signals PLOAD2 and PLOAD3 are provided to the $(3k)^{th}$ page buffer PB.

In FIG. 34, the a load signal PLOADa is provided to the $(3k-2)^{th}$ page buffer PB, where k is an integer greater than or equal to 1, such that the a load signal PLOADa is controlled to the first level or the second level. The b load signal PLOADb is provided to the $(3k-1)^{th}$ page buffer PB, such that the b load signal PLOADb is controlled to the third level or the first level. The c load signal PLOADc is provided to the $(3k)^{th}$ page buffer PB, such that the c load signal PLOADc is controlled to the second level or the third level. That is, the read and write circuit 130g in FIG. 33 and the read and write circuit 130h in FIG. 34 have an equivalent relationship.

Figure 35:
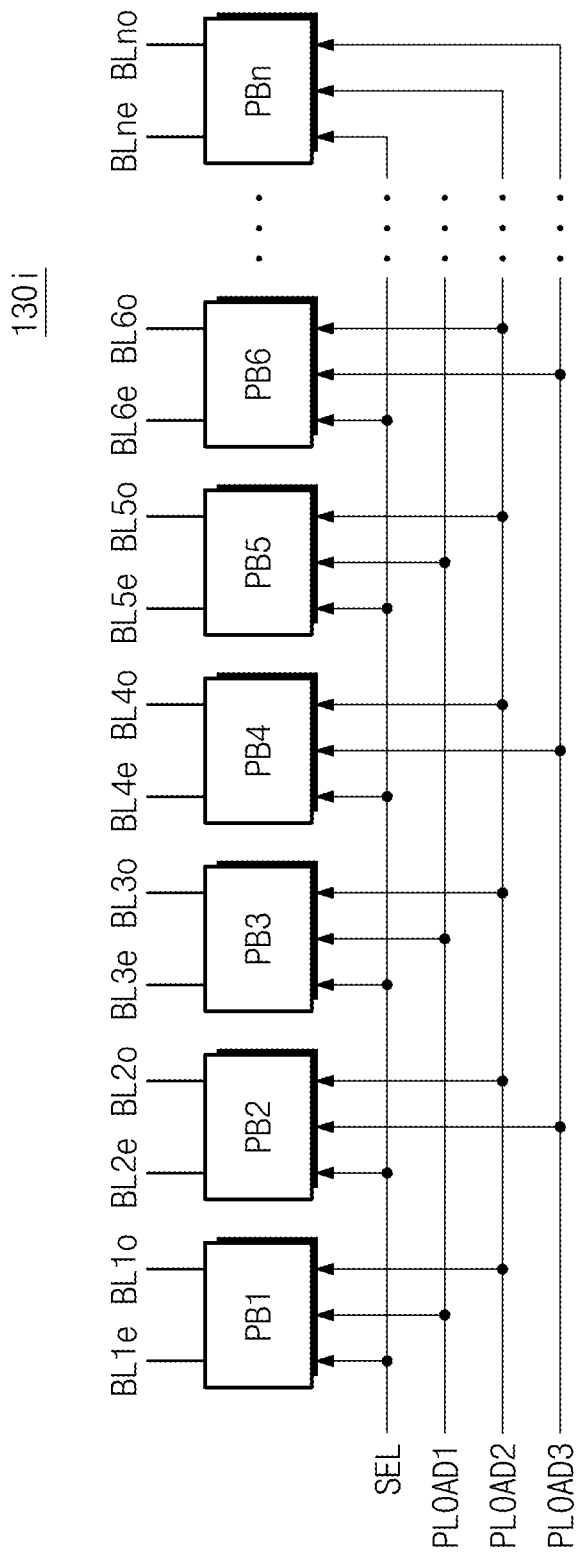
FIG. 35 is a block diagram illustrating a ninth embodiment of a read and write circuit, according to the inventive concept.

FIG. 35 is a block diagram illustrating a ninth embodiment of a read and write circuit 130i. Referring to FIG. 35, the read and write circuit 130i includes multiple page buffers PB1-PBn. The page buffers PB1-PBn are connected to even bit lines BL1e-BLne and odd bit lines BL1o-BLno. One page buffer PB is connected to one even bit line BLe and one odd bit line BLo.

A select signal SEL and first through third load signals PLOAD1-PLOAD3 are provided to the page buffers PB1-PBn. Each of the page buffers PB1-PBn has the same structure as the page buffer PBb described with reference to FIG. 30.

As described with reference to FIGS. 16 through 20, the bit lines BL1e-BLne and BL1o-BLno are divided into first through third groups. Bit lines BL of the first group are the closest bit lines BL, bit lines BL of the second group are the medium bit lines BL, and bit lines BL of the third group are the farthest bit lines BL. It is assumed that bit lines are counted in the order from the bit line BL on the left to the bit line BL on the right. That is, it is assumed that a first even bit line BL1e is the first bit line and a first odd bit line BL1o is the second bit line. At this time, $(4k-3)^{th}$ bit lines are in the bit lines BL of the first group, $(2k)^{th}$ bit lines are included in the bit lines BL of the second group, and $(4k-1)^{th}$ bit lines are included in the bit lines BL of the third group, where k is an integer greater than or equal to 1.

The first load signal PLOAD1 has a level corresponding to the bit lines BL of the first group. The second load signal PLOAD2 has a level corresponding to the bit lines BL of the second group. The third load signal PLOAD3 has a level corresponding to the bit lines BL of the third group. The level of the second load signal PLOAD2 is lower than the level of the first load signal PLOAD1, and the level of the third load signal PLOAD3 is lower than the level of the second load signal PLOAD2.

The first load signal PLOAD1 is provided to the page buffers PB1, PB3 and PB5 connected to $(4k-3)^{th}$ bit lines BL1e, BL3e and BL5e. The second load signal PLOAD2 is provided to the page buffers PB1-PB6 connected to $(2k)^{th}$ bit lines BL1o, BL2o, BL3o, BL4o, BL5o and BL6o. The third load signal PLOAD3 is provided to the page buffers PB2, PB4 and PB6 connected to $(4k-1)^{th}$ bit lines BL2e, BL4e and BL6e.

Each of the page buffers PB1-PBn selects one of an even bit line BLe and an odd bit line BLo in response to the select signal SEL, and selects one of the two load signals PLOAD being received. For example, the first page buffer PB1 is connected to the even bit line BL1e of the first group and the odd bit line BL1o of the second group. When the even bit line BL1e is selected, the first load signal PLOAD1 is provided to the load transistor LT. When the odd bit line BL1e is selected, the second load signal PLOAD2 is provided to the load transistor LT.

Figure 36:
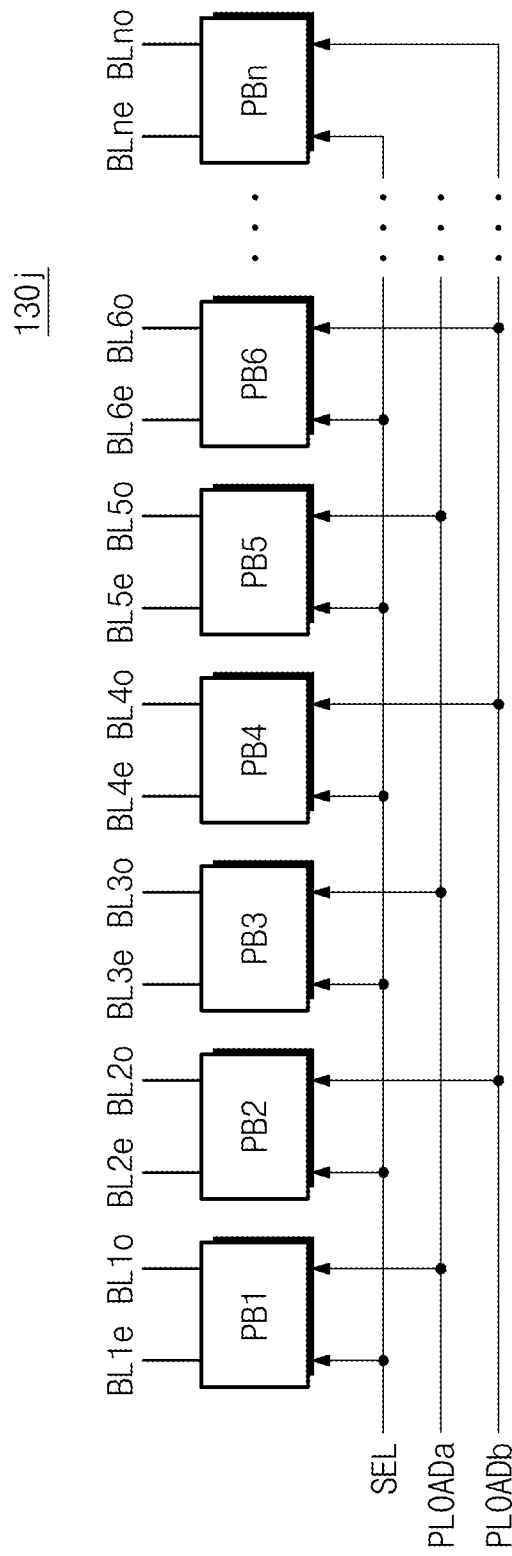
FIG. 36 is a block diagram illustrating a tenth embodiment of a read and write circuit, according to the inventive concept.

FIG. 36 is a block diagram illustrating a tenth embodiment of a read and write circuit 130j. Referring to FIG. 36, the read and write circuit 130j includes multiple page buffers PB1-PBn. The page buffers PB1-PBn are connected to even bit lines BL1e-BLne and odd bit lines BL1o-BLno. One page buffer PB is connected to one even bit line BLe and one odd bit line BLo. A select signal SEL and first and second load signals PLOADa and PLOADb are provided to the page buffers PB1-PBn. Each of the page buffers PB1-PBn has the same structure as the page buffer PBc described with reference to FIG. 32.

As described with reference to FIGS. 16 through 20, the bit lines BL1e-BLne and BL1o-BLno are divided into first through third groups. Bit lines BL of the first group are the closest bit line BL, bit lines BL of the second group are the medium bit lines BL, and bit lines BL of the third group are the farthest bit lines BL. It is assumed that bit lines are counted in the order from the bit line BL on the left to the bit line BL on the right. That is, it is assumed that a first even bit line BL1e is the first bit line and a first odd bit line BL1o is the second bit line. At this time, $(4k-3)^{th}$ bit lines are included in the bit lines BL of the first group, $(2k)^{th}$ bit lines are included in the bit lines BL of the second group, and $(4k-1)^{th}$ bit lines are included in the bit lines BL of the third group.

The a load signal PLOADa is controlled to a first level or a second level according to the select signal SEL. The b load signal PLOADb is controlled to a third level or the second level according to the select signal SEL.

The first level of the load signal PLOAD corresponds to the bit lines BL of the first group. The second level of the load signal PLOAD corresponds to the bit lines BL of the second group. The third level of the load signal PLOAD corresponds to the bit lines BL of the third group. The second level is lower than the first level and the third level is lower than the second level.

Referring to FIG. 35, the first and second load signals PLOAD1 and PLOAD2 are provided to the $(2k-1)^{th}$ page buffer PB, where k is an integer greater than or equal to 1. The third and first load signals PLOAD3 and PLOAD1 are provided to the $(2k)^{th}$ page buffer PB.

In FIG. 36, the a load signal PLOADa is provided to the $(2k-1)^{th}$ page buffer PB, where k is an integer greater than or equal to 1. The a load signal PLOADa is controlled to the first level or the second level. The b load signal PLOADb is provided to the $(2k)^{th}$ page buffer PB. The b load signal PLOADb is controlled to the third level or the first level. That is, the read and write circuit 130i in FIG. 35 and the read and write circuit 130j in FIG. 36 have an equivalent relationship.

As described above, according to various embodiments, precharge voltages are controlled depending on the distance between each of the cell strings CS and the respective closest doping regions. As the distance between each of the cell strings CS and the closest doping regions increases, levels of precharge voltages being provided to the cell strings CS decrease. Similarly, as the distance between each of the cell strings CS and the closest doping regions decreases, levels of precharge voltages being provided to the cell strings CS are increase.

In aforementioned embodiments, when a read operation is performed, discrimination of data is performed by detecting voltages of bit lines BL. However, when a read operation is performed, the discrimination of data may be performed by detecting the amounts of cell currents flowing out of the bit line BL, in which case the selected memory cell MC connected to a specific bit line BL may be discriminated to be turned off. When The same precharge voltage is provided to the bit lines BL, as the distance between the cell string CS and the closest doping region increases, the amplitude of cell current decreases. A read error may occur due to the reduction of cell current.

To prevent those problems, precharge voltages may be controlled depending on the distance between each of the cell strings CS and the respective closest doping region. For instance, as the distance between each of the cell strings CS and the closest doping region to each of the cell strings CS increases, levels of precharge voltages being provided to the cell string CS may be increased. Similarly, as the distance between each of the cell strings CS and the closest doping region to each of the cell strings CS decreases, levels of precharge voltages being provided to the cell string CS may be decreased.

When the level of precharge voltage increases, the amount of cell is increases. Thus, if the level of precharge voltage is increased as the distance between the cell string CS and the closest doping region increases, the phenomenon that the amount of cell current decreases due to the increased distance of the horizontal channel may be compensated for.

Figure 37:
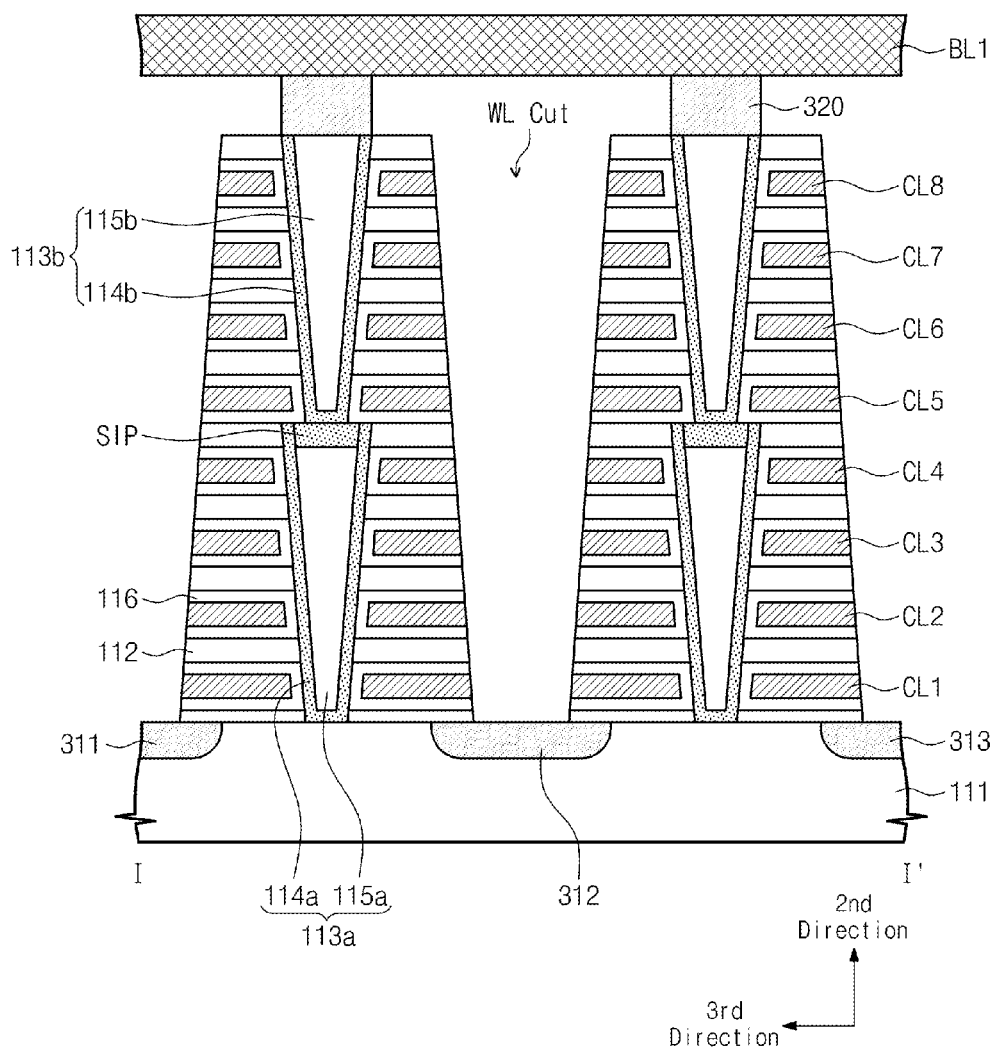
FIG. 37 illustrates another example of cross sectional view taken along the line I-I1 of FIG. 3, according to embodiments of the inventive concept.

FIG. 37 illustrates another example of cross sectional view taken along the line I-I1 of FIG. 3. The cross sectional view of FIG. 37 is substantially the same with the cross sectional view of FIG. 4, except that the pillar 113 includes a first sub pillar 113a and a second sub pillar 113b.

A channel layer 114a of each of the first sub pillars 113a is formed of the same material as the channel layer 114 described with reference to FIG. 4. A channel layer 114b of each of the second sub pillars 113b is likewise formed of the same material as the channel layer 114 described with reference to FIG. 4. An internal material 115a of each of the first sub pillars 113a is the same as the internal material 115 described with reference to FIG. 4. An internal material 115*b* of each of the second sub pillars 113*b* is likewise the same material as the internal material 115 described with reference to FIG. 4.

A silicon pad SIP may be provided on an upper portion of the first sub pillar 113*a*. The channel layer 114*a* of the first sub pillar 113*a* may be connected to the channel layer 114*b* of the second sub pillar 113*b* through the silicon pad SIP. Conductive materials CL having a height corresponding to the silicon pad SIP, for example, the fourth conductive materials CL4, the fifth conductive materials CL5 or the fourth and fifth conductive materials CL4 and CL5, may be used as dummy word lines DWL.

The pillars 113 of the memory blocks BLK2-BLK5 in accordance with the first through fourth embodiments of the inventive concept may include the sub pillars 113*a* and 113*b*.

Figure 38:
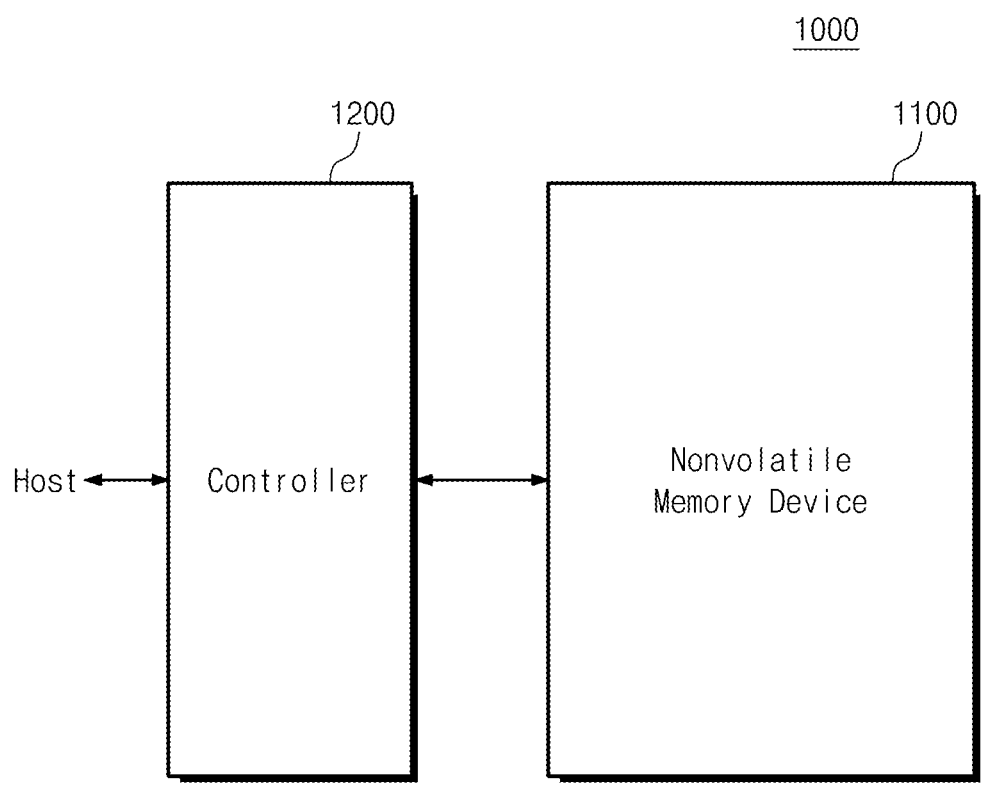
FIG. 38 is a block diagram illustrating a memory system, according to embodiments of the inventive concept.

FIG. 38 is a block diagram illustrating a memory system 1000 in accordance with various embodiments. Referring to FIG. 38, the memory system 1000 includes a nonvolatile memory device 1100 and a controller 1200.

The nonvolatile memory device 1100 may have the same structure as the nonvolatile memory devices 100 described above with reference to FIG. 1, and may operate in the same manner. That is, the nonvolatile memory device 1100 is configured to control levels of precharge voltages differently depending on the distance on a substrate between doping regions operating as cell strings CS and a common source line CSL.

The controller 1200 is connected to a host and the nonvolatile memory device 1100. The controller 1200 is configured to access the nonvolatile memory device 1100 in response to a request from the host. For instance, the controller 1200 is configured to control read, write, erasing and background operations of the nonvolatile memory device 1100. The controller 1200 is configured to provide an interface between the nonvolatile memory device 1100 and the host, and to drive firmware for controlling the nonvolatile memory device 1100.

In addition, the controller 1200 is configured to provide a control signal CTRL and an address ADDR to the nonvolatile memory device 1100. The controller 1200 is configured to exchange data DATA with the nonvolatile memory device 1100. The controller 1200 provides a read command and an address to the nonvolatile memory device 1100. The nonvolatile memory device 1100 performs a read operation according to a read method in accordance with the various embodiments in response to a read command and an address being provided from the controller 1200.

The controller 1200 provides a program command and an address to the nonvolatile memory device 1100. The nonvolatile memory device 1100 performs a programming operation in response to the program command and the address provided from the controller 1200. At this time, the nonvolatile memory device 1100 performs a verification read operation according to a read method in accordance with the various embodiments of the nonvolatile memory device 1100.

The controller 1200 may further include well known constituent elements, such as a random access memory (RAM), a processing unit, a host interface and a memory interface, for example. The RAM is used as at least one of an operation memory of a processing unit, a cache memory between the nonvolatile memory device 1100 and the host, and a buffer memory between the nonvolatile memory device 1100 and the host. The processing unit controls the entire operation of the controller 1200.

The host interface includes a protocol for exchanging data between the host and the controller 1200. The controller 1200 is configured to communicate with the outside (host) through at least one of various interface protocols, such as a universal serial bus (USB) protocol, a multimedia card (MMC) protocol, a peripheral component interconnection (PCI) protocol, a PCI-express protocol, an advanced technology attachment (ATA) protocol, a serial-ATA protocol, a parallel-ATA protocol, a small computer small interface (SCSI) protocol, an enhanced small disk interface (IDE) protocol and an integrated drive electronics (IDE) protocol, for example. The memory interface interfaces with the nonvolatile memory device 1100. For example, the memory interface may include a NAND interface or a NOR interface.

The memory system 100 may be configured to additionally include an error correction block. The error correction block is configured to detect and correct errors in data read from the nonvolatile memory device 1100. The error correction block may be provided as a constituent element of the controller 1200 or of the nonvolatile memory device 1100.

The controller 1200 and the nonvolatile memory device 1100 may be integrated in one semiconductor device, which may constitute a memory card, for example. That is, the controller 1200 and the nonvolatile memory device 1100 may be integrated in a semiconductor device constituting a memory card, such as a personal computer memory card international association (PCMCIA) card, a compact flash (CF) card, a smart media card (SMC), a memory stick, a multimedia card (MMC, RS-MMC, MMCmicro), a SD card (SD, miniSD, SDHC) and a universal flash memory device (UFS), for example.

The controller 1200 and the nonvolatile memory device 1100 may be integrated in one semiconductor device to constitute a solid state drive (SSD). The SSD includes a storage device configured to store data in a semiconductor memory. When the memory system 1000 is used as a SSD, an operation speed of the host connected to the memory system 1000 is greatly improved.

The memory system 1000 may be provided as one of various constituent elements of an electronic device, such as a computer, an ultra mobile PC (UMPC), a work station, a net book, a personal digital assistant (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a three dimensional television, a digital audio recorder, a digital audio player, a digital picture recorder, a digital picture player, a digital video recorder, a digital video player, a storage constituting a data center, a device that can transmit/receive data in a wireless environment, one of various electronic devices constituting a home network, one of various electronic devices constituting a computer network, one of various electronic devices constituting a telematics network, a RFID device or one of various constituent elements constituting a computing system, for example.

The nonvolatile memory device 1100 or the memory system 1000 may be mounted in various types of packages. For example, the nonvolatile memory device 1100 or the memory system 1000 may be mounted in types of packages, such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat-pack (TQFP), system in package (SIP), multi chip package (MCP), wafer-level fabricated package (WFP), wafer-level processed stack package (WSP) and mounted, for example.

Figure 39:
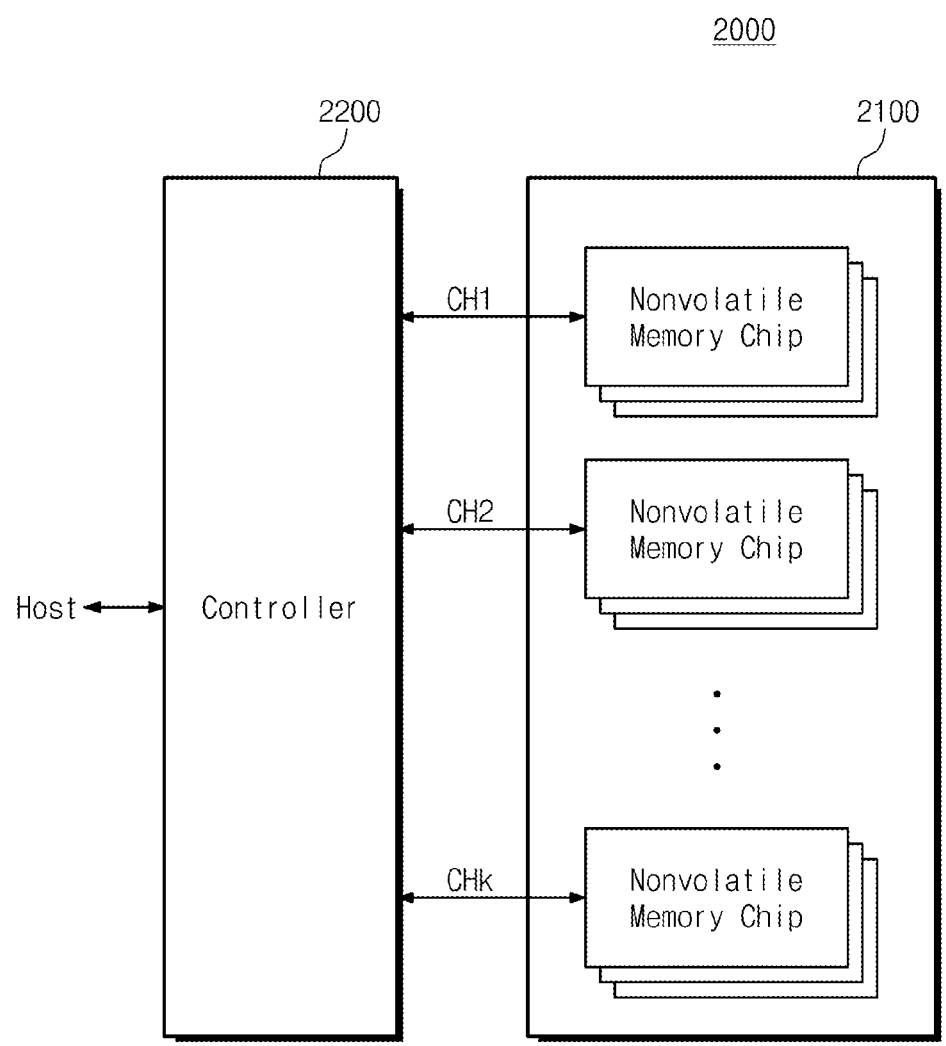
FIG. 39 is a block diagram illustrating an application example of memory system of FIG. 38, according to embodiments of the inventive concept.

FIG. 39 is a block diagram illustrating an application example of memory system 1000 of FIG. 38. Referring to FIG. 39, a memory system 2000 includes a nonvolatile memory device 2100 and a controller 2200. The nonvolatile memory device 2100 includes multiple nonvolatile memory chips, which may be divided into multiple groups. Each of the groups of the nonvolatile memory chips is configured to communicate with the controller 2200 through one common channel. In the example shown in FIG. 39, the nonvolatile memory chips communicate with the controller 2200 through first through $k^{th}$ channels CH1-CHk.

Each of the nonvolatile memory chips may have the same structure as the nonvolatile memory device 100 described with reference to FIG. 1, and may operate in a same manner. That is, each of the nonvolatile memory chips controls levels of precharge voltages differently depending on the distance on a substrate between doping regions operating as cell strings CS and a common source line CSL.

In FIG. 39, the nonvolatile memory chips are connected to one channel. However, the memory system 2000 may be changed such that one nonvolatile memory chip is connected to one channel.

Figure 40:
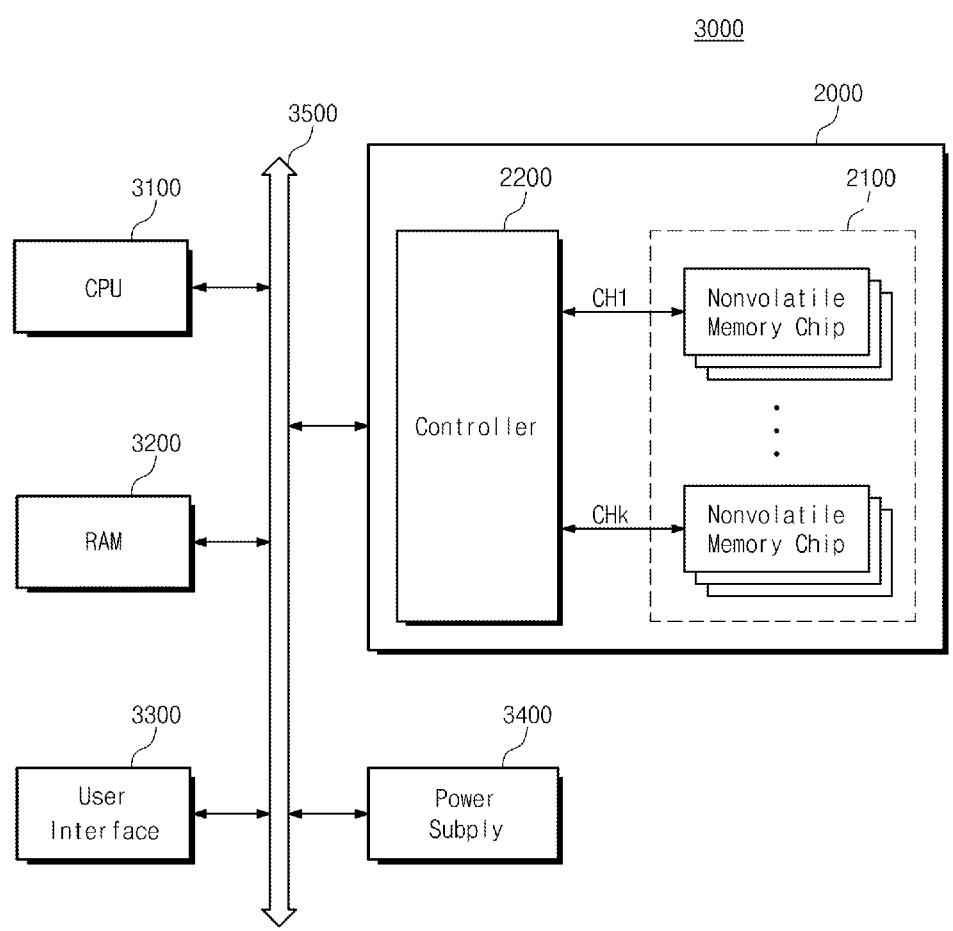
FIG. 40 is a block diagram illustrating a computing system including the memory system described with reference to FIG. 39.

FIG. 40 is a block diagram illustrating a computing system 3000 including the memory system 2000 described with reference to FIG. 39. Referring to FIG. 40, the computing system 3000 includes a central processing unit 3100, a RAM 3200, a user interface 3300, a power supply 3400 and a memory system 2000.

The memory system 2000 is electrically connected to the central processing unit 3100, the RAM 3200, the user interface 3300 and the power supply 3400 through a system bus 3500. Data provided through the user interface 3300 or processed through the central processing unit 3100 is stored in the memory system 2000.

In FIG. 40, a nonvolatile memory device 2100 is connected to the system bus 3500 through the controller 2200. However, the nonvolatile memory device 2100 may be configured to directly connect the system bus 3500.

In FIG. 40, the memory system 2000 described with reference to FIG. 39 is provided. However, the memory system 2000 may be replaced with the memory system 1000 described with reference to FIG. 38, for example. The computing system 3000 may be configured to include all the memory systems 1000 and 2000 described with reference to FIGS. 38 and 39.

According to the inventive concept, read errors due to differences in distance between a common source line and a cell string may be prevented. Thus, a nonvolatile memory device having improved reliability, a method of reading the same and a memory system including the same are provided.

In the aforementioned embodiments, for convenience of description, the order of operation methods in accordance with some embodiments is described with reference to a flow chart. However, the order of operations may be modified without departing from the spirit and scope of the inventive concept.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A nonvolatile memory device comprising:
    a substrate;
    a plurality of doping regions extending in a first direction along the substrate and being spaced apart from one another in a second direction;
    a plurality of cell strings provided according to a specific pattern between adjacent first and second doping regions among the plurality of doping regions, each of the cell strings comprising a plurality of cell transistors stacked in a third direction perpendicular to the substrate; and
    a plurality of page buffers connected to the plurality of cell strings through a plurality of bit lines, the page buffers being configured to provide precharge voltages to the bit lines during a read operation,
    wherein levels of the precharge voltages provided to the bit lines vary depending on distances between the cell strings and at least one of the first and second doping regions, respectively.

2. The nonvolatile memory device of claim 1, wherein the levels of the precharge voltages provided to the bit lines are controlled differently depending on the distances between the cell strings and a closest doping region of the first and second doping regions, respectively.

3. The nonvolatile memory device of claim 2, wherein as the distance between each of the cell strings and the respective closest doping region increases, the levels of the precharge voltages are reduced.

4. The nonvolatile memory device of claim 2, wherein as the distance between each of the cell strings and the closest respective doping region increases, the levels of the precharge voltages are increased.

5. The nonvolatile memory device of claim 1, further comprising:
    control logic configured to generate at least one load signal to be provided to the page buffers,
    wherein each of the pager buffers comprises a latch circuit and a load transistor, the load transistor electrically connecting a power supply node to one bit line among the plurality of bit lines through the latch circuit in response to at least one load signal.

6. The nonvolatile memory device of claim 5, wherein the load transistor of each of the page buffers has a threshold voltage controlled the distance between each of the cell strings and the closest respective doping region.

7. The nonvolatile memory device of claim 5, wherein the control logic is configured to change a level of at least one load signal provided to the page buffers depending on the distances between the cell strings and the first and second doping regions, respectively.

8. The nonvolatile memory device of claim 7, wherein the page buffers are divided into m groups, where m is an integer greater than or equal to 1, depending on the distances between the cell strings and the first and second doping regions, respectively, and wherein the control logic is configured to provide load signals having different levels to the m groups of the page buffers respectively.

9. The nonvolatile memory device of claim 1, further comprising:
    control logic configured to generate at least one load signal and one select signal provided to the plurality of page buffers,
    wherein each of the page buffers comprises:
        a sharing circuit configured to be connected to adjacent two bit lines among the bit lines and to select one of the adjacent bit lines in response to the select signal;
        a latch circuit connected to the sharing circuit; and
        a load transistor connected between the power supply node and the latch circuit, electrically connecting the power supply node to the selected bit line between the adjacent bit lines through the latch circuit and the sharing circuit under control of at least one load signal.

10. The nonvolatile memory device of claim 9, wherein the control logic is further configured to change a level of at least one load signal being provided to the page buffers depending on distances between the plurality of cell strings and the first and second doping regions, respectively.

11. The nonvolatile memory device of claim 10, wherein the plurality of bit lines is divided into m groups, where m is an integer greater than or equal to 1, depending on the distances between the plurality of cell strings and the first and second doping regions, respectively, and wherein the control logic is further configured to provide m load signals to the page buffers, the m load signals having different levels and correspond to the m groups of the bit lines respectively.

12. The nonvolatile memory device of claim of claim 11, wherein each of the page buffers is configured to receive two load signals having different levels corresponding to the adjacent bit lines among m load signals having different levels, respectively.

13. The nonvolatile memory device of claim 12, wherein in each of the page buffers, one of the two load signals having different levels is provided to the load transistor in response to the select signal.

14. The nonvolatile memory device of claim 10, wherein the plurality of page buffers is divided into n groups, where n is an integer greater than or equal to 1, depending on distance between the plurality of cell strings and the first and second doping regions, respectively, and wherein the control logic is further configured to provide n drive signals to the n groups of the page buffers respectively.

15. The nonvolatile memory device of claim 14, wherein the control logic is further configured to change a level of each of the n drive signals according to the select signal.

16. The nonvolatile memory device of claim 1, wherein the read operation comprises a verification reading operation.

17. A method of reading a memory cells in a plurality of cell strings of a nonvolatile memory device, the method comprising:
setting a precharge voltage for each cell string of the plurality of cell strings, a level of the precharge voltage comprising one of a plurality of different precharge voltage levels depending on a distance of the cell string from a doping region on a substrate; and
providing the set precharge voltage to each cell string of the plurality of cell strings through a plurality of bit lines connected to the plurality of cell strings.

18. The method of claim 17, wherein a first precharge voltage is set for each cell string a first distance from the doping region and a second precharge voltage is set for each cell string a second distance from the doping region, wherein the first distance is less than the second distance and the first precharge voltage is greater than the second precharge voltage.

19. The method of claim 18, wherein a third precharge voltage is set for each cell string a third distance from the doping region, wherein the second distance is less than the third second distance and the second precharge voltage is greater than the third precharge voltage.

20. The method of claim 17, wherein the precharge voltages are provided to the plurality of cell strings lines by a corresponding plurality of page buffers connected to the plurality of cell strings through the plurality of bit lines.

* * * * *